(12) United States Patent
Maekawa

(10) Patent No.: US 11,519,973 B2
(45) Date of Patent: Dec. 6, 2022

(54) OUTPUT MODULE OF INDUSTRIAL CONTROL APPARATUS

(71) Applicant: DENSO WAVE INCORPORATED, Aichi-pref. (JP)

(72) Inventor: Takaaki Maekawa, Chita-gun (JP)

(73) Assignee: DENSO WAVE INCORPORATED, Aichi-Pref. (JP)

( * ) Notice: Subject to any disclaimer, the term of this patent is extended or adjusted under 35 U.S.C. 154(b) by 113 days.

(21) Appl. No.: 17/022,158

(22) Filed: Sep. 16, 2020

(65) Prior Publication Data

US 2021/0088598 A1    Mar. 25, 2021

(30) Foreign Application Priority Data

Sep. 20, 2019   (JP) .............................. JP2019-171670

(51) Int. Cl.
*G01R 31/52*   (2020.01)
*G01R 19/165*  (2006.01)

(52) U.S. Cl.
CPC ......... *G01R 31/52* (2020.01); *G01R 19/1659* (2013.01); *G01R 19/16523* (2013.01)

(58) Field of Classification Search
CPC .............. G01R 31/52; G01R 19/16523; G01R 19/1659; H03K 17/082; H03K 17/18
See application file for complete search history.

(56) References Cited

U.S. PATENT DOCUMENTS

| | | | |
|---|---|---|---|
| 7,408,274 B2* | 8/2008 | Sullivan ................. | A61G 3/062 307/130 |
| 2008/0093924 A1* | 4/2008 | Matsumoto .......... | G01R 31/006 307/10.1 |
| 2010/0231257 A1* | 9/2010 | Baddela ................. | H03K 17/18 326/62 |

FOREIGN PATENT DOCUMENTS

| | | | | |
|---|---|---|---|---|
| DE | 102013204573 A1 * | 9/2014 | ............. | H03K 17/18 |
| JP | 2019-020822 A | 2/2019 | | |

* cited by examiner

*Primary Examiner* — Feba Pothen
(74) *Attorney, Agent, or Firm* — Harness, Dickey & Pierce, P.L.C.

(57) ABSTRACT

An output module of an industrial control apparatus includes an output circuit controlling an electrical connection between a power supply terminal and an output terminal and a controller controlling an operation of the output circuit. The output circuit includes multiple switches, which are connected in series between the power supply terminal and the output terminal, and a voltage divider circuit outputting a divided voltage. The controller controls on/off states of the switches, and detects a short circuit of the switches based on the divided voltage. When the divided voltage detected during an off period while the multiple switches are in off states is within a normal voltage range, the controller determines that no short circuit is occurred. When the divided voltage detected during the off period is out of the normal voltage range, the controller determines that a short circuit is occurred in at least one of the switches.

4 Claims, 14 Drawing Sheets

US 11,519,973 B2

OUTPUT MODULE OF INDUSTRIAL CONTROL APPARATUS

CROSS REFERENCE TO RELATED APPLICATION

The present application claims the benefit of priority from Japanese Patent Application No. 2019-171670 filed on Sep. 20, 2019. The entire disclosure of the above application is incorporated herein by reference.

TECHNICAL FIELD

The present disclosure relates to an output module of an industrial control apparatus.

BACKGROUND

There has been known an output module of an industrial control apparatus which has a self-diagnosis function.

SUMMARY

An output module of an industrial control apparatus includes an output circuit controlling an electrical connection between a power supply terminal and an output terminal and a controller controlling an operation of the output circuit. The output circuit includes multiple switches, which are connected in series between the power supply terminal and the output terminal, and a voltage divider circuit outputting a divided voltage. The controller controls on/off states of the switches, and detects a short circuit of the switches based on the divided voltage. When the divided voltage detected during an off period while the multiple switches are in off states is within a normal voltage range, the controller determines that no short circuit is occurred. When the divided voltage detected during the off period is out of the normal voltage range, the controller determines that a short circuit is occurred in at least one of the switches.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
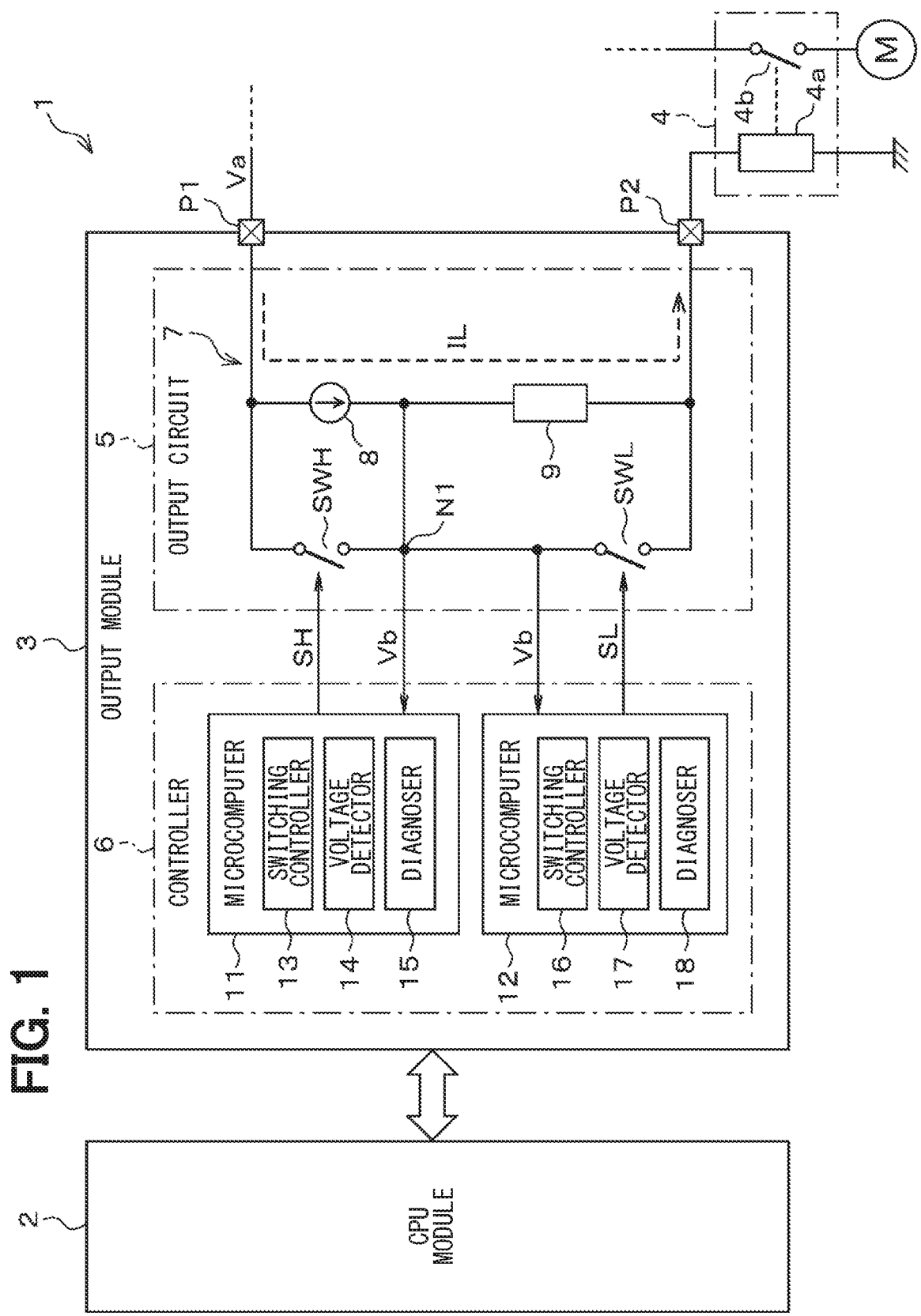
FIG. 1 is a diagram schematically showing a configuration of a programmable logic controller (PLC) according to a first embodiment.

An industrial control apparatus, such as a programmable logic controller is provided with an output module that performs a predetermined output control based on a command output from a CPU module that controls an overall operation of the industrial control apparatus. In the present disclosure, the programmable logic controller will be abbreviated as PLC.

The above-described output control includes a control of power supply to an externally connected load. An output module that performs such output control includes an output circuit that is connected to a power supply terminal and an output terminal. A power supply voltage is applied to the power supply terminal, and the output terminal is connected to an external load. The output circuit controls an electrical connection between the power supply terminal and the output terminal. In order to achieve multiple output controls, the output circuit is usually connected in series between the power supply terminal and the output terminal, and includes two switches that turn on and turn off in the same way. The switches may be provided by field effective transistors (FET).

With consideration of functional safety, the output module of the PLC is required to have a self-diagnosis function that periodically verifies whether output module is able to shut off the power supply to the load, that is, whether an ability to turn off the output circuit is functioning properly. In the output module having such configuration, it is necessary to verify that whether the two switches can be turned off independently from one another. In other words, it is necessary to verify that there is no short circuit in each of the two switches. Therefore, the above-mentioned diagnosis was performed by alternately turning off each switch independently. Hereinafter, such a diagnosis method is referred to as a comparative example.

In the comparative example, it is necessary to alternately turn off the two switches independently. Thus, the time required for diagnosis, that is, diagnosis period is relatively long. During the diagnosis period, one of the two switches is turned off, the power supply to the load is cut off. Therefore, in the comparative example, the power supply to the load is cut off for a relatively long period of time necessary for diagnosis. When the diagnosis is performed in a normal operation state which is a state the power is normally supplied to the load, it is necessary to adopt a load which continues operation even though the power supply is shut off for the predetermined diagnosis period. Specifically, the load is required to have a low responsiveness to power interruption, that is, a slow reaction speed.

However, the load having a low responsiveness to power interruption may fail to stop operation in an emergency circumstance. For example, in a system, when a solenoid adopted as a load controls a device, such as a motor, to stop an operation in an emergency circumstance, the operation of the motor needs to be stopped immediately in response to an interruption of the power supplied from the output module to the load. However, in the load having a low responsiveness to power interruption, even though the power supply from the output module is interrupted, the device controlled by the load needs time to stop the operation and an emergency stop of the device may be delayed due to the load that has low responsiveness.

The present disclosure relates to an output module of an industrial control apparatus equipped with an output circuit that electrically connects or disconnects a power supply terminal to which a power supply voltage is applied and an output terminal connected to an external load.

According to an aspect of the present disclosure, an output module of an industrial control apparatus includes an output circuit controlling an electrical connection between a power supply terminal to which a power source voltage is applied and an output terminal connected to an external load and a controller controlling an operation of the output circuit. The output circuit includes multiple switches and a voltage divider circuit. The multiple switches are connected in series between the power supply terminal and the output terminal and turn on and turn off in a same manner. The voltage divider circuit outputs a divided voltage by dividing a voltage between the power supply terminal and the output terminal. The controller includes a switching controller and a diagnoser, and the switching controller controls turning on and turning off of the multiple switches. The diagnoser detects a short circuit occurred in the multiple switches based on the divided voltage output from the voltage divider circuit. The voltage divider circuit includes multiple generators each of which generates a voltage between two terminals of the voltage generator when a current flows through the voltage generator, and the multiple voltage generators are respectively connected in parallel with the multiple switches. The divided voltage has a normal voltage range that is preliminarily set based on the divided voltage detected when the multiple switches are turned off in a normal operation state. When the divided voltage detected during an off period while the multiple switches are in off states is within the normal voltage range, the diagnoser determines that no short circuit is occurred in the multiple switches. When the divided voltage detected during the off period is out of the normal voltage range, the diagnoser determines that the short circuit is occurred in at least one of the multiple switches.

The voltage divider circuit includes multiple voltage generators connected in series, and a voltage is generated between two terminals of each voltage generator when a current flows through the voltage generator. The multiple voltage generators are respectively connected in parallel with the multiple switches. The divided voltage output from the voltage divider circuit changes according to on or off states of the switches. When the switch connected close to the power supply terminal is in on state and remaining switch is in off state, the divided voltage is close to the power supply voltage. When the switch connected close to the output terminal is in on state and remaining switch is in off state, the divided voltage is close to 0 volt. When all of the switches are in on states, the divided voltage has an intermediate potential between the power supply voltage and 0 volt.

In the normal operation state, that is, no short circuit occurs in the multiple switches, the divided voltage output from the voltage divider circuit has the intermediate potential during an off period while all of the switches are controlled to be in off states by the switching controller. When at least one of the multiple switches has a short circuit, the divided voltage output from the voltage divider circuit during the off period while all of the switches are controlled to be in off states has a potential different from the intermediate potential. Specifically, the divided voltage output from the voltage divider circuit during the off period has the same potential of the divided voltage when the switch having the short circuit is in on state. Thus, the divided voltage output from the voltage divider circuit when one of the switches is short circuited is close to the power supply voltage or 0 volt.

With consideration of the above-described point, a normal voltage range of the divided voltage is preliminarily set based on the divided voltage, that is, the intermediate potential detected when the switches are turned off under the normal operation state. When the divided voltage detected during the off period while the multiple switches are in off states is within the normal voltage range, the diagnoser determines that no short circuit is occurred in the switches. When the divided voltage detected during the off period is out of the normal voltage range, the diagnoser determines that the short circuit is occurred in at least one of the switches. With this configuration, the multiple switches have no need to be turned off independent and alternately from one another as described in the comparative example. That is, with this configuration, all of the switches can be turned off at a same time without shifting the off period of each switch, and thereby the period required for diagnosing the output circuit can be shortened.

With the above-described configuration, the period required for diagnosing the output circuit is shortened compared with the comparative example. Suppose that the short circuit diagnose of switch is executed during a normal operation state of the load in which a power, that is, power voltage is normally supplied to the load. In this case, a load having a high responsiveness to the power interruption can be adopted in the above configuration compared with the comparative example. The load having a high responsiveness to the power interruption has a high reaction speed to the power interruption. When an apparatus controlled by the load needs to be stopped in an emergency case, the operation of the apparatus can be surely and promptly stopped by interrupting the power supply from the output module to the load, thereby ensuring a good safety.

With the above configuration, the diagnosis for detecting the short circuit of the switch can be executed in a power off state of the load. That is, the diagnosis can be executed while no power supply voltage is applied to the load. In the power off state of the load, the switching controller controls all of the switches to off states so that no power is supplied to the load. Thus, no current flows from the power supply terminal to the load through the switches. However, a current flows through the voltage generators of the voltage divider circuit, and flows to the load. When the current flowing through the voltage generator to the load increases to an enough high current to power and operate the load, the load will be operated erroneously even when set in the power off state.

With consideration of above-described point, during the off period while the switches are in off states, the current flowing through the voltage generators may be set to be lower than a predetermined off current. Herein, the off current is preliminarily set to be lower than a lower limit of an operation current that powers the load to operate. With this configuration, an erroneous turn-on of the load by the current flowing through the voltage generators can be avoided in the power off state of the load. Thus, the load can be surely maintained in the power off state.

The voltage divider circuit may further include a diode. The multiple voltage generators includes a downstream voltage generator. The diode is connected in parallel with the downstream voltage generator, and an anode of the diode and one terminal of the downstream voltage generator are directly connected with the output terminal. With this configuration, when a power supply failure occurs, that is, when the output terminal is short circuited to a point having the power supply voltage, the power supply voltage is always supplied to the load even when the switches of the output circuit are turned off. This kind of failure cannot be eliminated on the side of the output module.

In the output module, it is necessary to reliably detect an occurrence of the power supply failure and transmit the detection result of power supply failure to the CPU module. In the configuration of the present disclosure, the voltage divider circuit includes the diode. When the power supply failure occurs, that is, the output terminal is short circuited to the power supply voltage, since the diode is connected in parallel to the voltage generator, the divided voltage becomes the same as the power supply voltage even though all of the switches are turned off by the switching controller. Therefore, the diagnoser 15 can determine the power supply failure at the output terminal based on the divided voltage.

The output module may further include a voltage detector detecting a value of the divided voltage. The multiple switches include an upstream switch and a downstream switch. The upstream switch is connected between the power supply terminal and an output node of the divided voltage, and the downstream switch is connected between the output node of the divided voltage and the output terminal. When the value of the divided voltage detected by the voltage detector is higher than an upper limit of the normal voltage range, the diagnoser determines that the short circuit is occurred in the upstream switch. When the value of the divided voltage detected by the voltage detector is lower than a lower limit of the normal voltage range, the diagnoser determines that the short circuit is occurred in the downstream switch. This configuration enables a detection of the short circuit occurred in the multiple switches, and also enables an identification of the switch in which the short circuit is occurred with a high accuracy.

According to another aspect of the present disclosure, an output module of an industrial control apparatus includes an output circuit controlling an electrical connection between a power supply terminal to which a power source voltage is applied and an output terminal connected to an external load; and a controller controlling an operation of the output circuit. The output circuit includes multiple switches and a voltage divider circuit, the multiple switches are connected in series between the power supply terminal and the output terminal and turn on and turn off in a same manner, and the voltage divider circuit outputs a divided voltage by dividing a voltage between the power supply terminal and the output terminal. The controller controls, by executing a computer program stored in a non-transitory computer readable memory, turning on and turning off of the multiple switches and detects a short circuit occurred in the multiple switches based on the divided voltage output from the voltage divider circuit. The voltage divider circuit includes multiple voltage generators each of which generates a voltage between two terminals of the voltage generator when a current flows through the voltage generator, and the multiple voltage generators are respectively connected in parallel with the multiple switches. The divided voltage has a normal voltage range that is preliminarily set based on the divided voltage detected when the multiple switches are turned off in a normal operation state. When the divided voltage detected during an off period while the multiple switches are in off states is within the normal voltage range, the controller determines that no short circuit is occurred in the multiple switches. When the divided voltage detected during the off period is out of the normal voltage range, the controller determines that the short circuit is occurred in at least one of the multiple switches.

Embodiments of the present disclosure will be described with reference to the accompanying drawings. The mutually corresponding parts in the following embodiments are designated by the same reference numerals and a detailed description is omitted for simplicity.

First Embodiment

The following will describe a first embodiment of the present disclosure with reference to FIG. 1 to FIG. 11.

As shown in FIG. 1, an industrial control apparatus PLC 1 includes a central processing unit (CPU) module 2 that controls an overall operation of the PLC 1, an output module 3, an input module (not shown). For example, the PLC 1 controls an operation of a motor M included in an industrial robot. Each module included in the PLC 1, such as the CPU module 2 or the output module 3 is configured to be able to communicate with one another via a bus communication line.

The output module 3 controls, based on a command from the CPU module 2, a power supply to a load. In the present disclosure, a solenoid 4 is provided as the load. More specifically, the output module 3 controls an application of a power supply voltage Va to the solenoid 4. The solenoid 4 includes a coil 4a and a contact 4b. The coil 4a is arranged between an output terminal P2 and a grand having a voltage of 0 volt. The contact 4b is closed when a current flows through the coil 4a. The contact 4b is configured to open or close a power supply path that supplies a power to the motor M.

The output module 3 includes a power supply terminal P1, an output terminal P2, an output circuit 5, and a controller 6. A power source voltage of, for example, 24 volts may is applied to the power supply terminal P1. The output terminal P2 is connected to an external load, that is, the solenoid 4. The output circuit 5 controls an electrical connection between the power supply terminal P1 and the output terminal P2. The output circuit 5 includes a first switching SWH, a second switch SWL, a voltage divider circuit 7. The switches SWH, SWL are connected in series between the power supply terminal P1 and the output terminal P2. In the present embodiment, the switch SWH, SWL may be provided by a semiconductor switching element, such as a metal-oxide-semiconductor field-effect transistor (MOSFET). The switch may also be provided by a mechanical relay.

The switch SWH is turned on or turned off based on a binary control signal SH output from the controller 6. Specifically, the switch SWH is turned on when the control signal SH is high level, and is turned off when the control signal SH is low level. The switch SWL is turned on or turned off based on a control signal SL output from the controller 6. Specifically, the switch SWL is turned on when the control signal SL is high level, and is turned off when the control signal SL is low level. The control signals SH and SL are the same kind of signal. Thus, the switches SWH and SWL are turned on and off in the same manner.

The voltage divider circuit 7 outputs a divided voltage. The divided voltage is an analog voltage obtained by dividing a voltage between the power supply terminal P1 and the output terminal P2. The voltage divider circuit 7 includes a current limiting circuit 8 and a resistor 9 connected in series with the current limiting circuit 8. The current limiting circuit 8 is a constant current source that outputs a constant current, and is connected between the power supply terminal P1 and a node N1. The node N1 is a common connection node of the first and second switches SWH, SWL. The current limiting circuit 8 is connected in parallel with the first switch SWH.

The node N1 is also an output node of the divided voltage output from the voltage divider circuit 7. In the following description, the first switch SWH arranged upstream closer to the power supply terminal P1 compared with the node N1 is referred to as an upstream switch. The second switch SWL arranged downstream closer to the output terminal P2 compared with the node N1 is referred to as a downstream switch SWL.

The resistor 9 is connected between the node N1 and the output terminal P2. That is, the resistor 9 is connected in parallel with the switch SWL. As described above, the current limiting circuit 8 is connected in parallel with the upstream switch SWH, and the resistor 9 is connected in parallel with the downstream switch SWL. When a current flows through the current limiting circuit 8 and the resistor 9, a voltage is generated between a terminal of the current limiting circuit 8 and a terminal of the resistor 9. Thus, the current limiting circuit 8 and the resistor 9 correspond to multiple voltage generators. The divided voltage output from the node N1 of the voltage divider circuit 7 functions as a diagnosis voltage Vb, and is applied to the controller 6. The diagnosis voltage Vb is used as a read back signal for diagnosing a failure of the output circuit 5.

The controller 6 controls an operation of the output circuit 5, and includes a first microcomputer 11 and a second microcomputer 12. The first microcomputer 11 is provided corresponding to the upstream switch SWH, and the second microcomputer 12 is provided corresponding to the downstream switch SWL. With consideration of a functional safety, the upstream switch SWH is controlled by the first microcomputer 11, and the downstream switch SWL is controlled by the second microcomputer 12 independent from the upstream switch SWH.

The microcomputer 11 includes a switching controller 13, a voltage detector 14, and a diagnoser 15. The switching controller 13 and the diagnoser 15 are provided by an execution of a computer program stored in a ROM of the microcomputer 11 by a CPU of the microcomputer 11. By execution of the computer program, the CPU executes a process corresponding to the program in order to provide the switching controller 13 and the diagnoser 15 in software manner. The switching controller 13 and the diagnoser 15 may also be are implemented in a hardware manner, or by a combination of software and hardware manners.

The switching controller 13 controls a turn-on and a turn-off of the upstream switch SWH by generating the control signal SH described above. The voltage detector 14 detects a value of the diagnostic voltage Vb. An analog to digital converter (AD converter) included in the microcomputer 11 may function as the voltage detector 14. Alternatively, an analog to digital converter provided outside of the microcomputer 11 may function as the voltage detector 14. The diagnoser 15 detects a short circuit of the switch SWH, SWL based on the diagnostic voltage Vb.

The microcomputer 12 includes a switching controller 16, a voltage detector 17, and a diagnoser 18. The switching controller 16 and the diagnoser 18 are provided by an execution of a computer program stored in a ROM of the microcomputer 12 by a CPU of the microcomputer 12. By execution of the computer program, the CPU executes a process corresponding to the program in order to provide the switching controller 16 and the diagnoser 18 in software manner. The switching controller 16 and the diagnoser 18 may also be implemented in a hardware manner, or by a combination of software and hardware manners.

The switching controller 16 controls a turn-on and a turn-off of the downstream switch SWL by generating the control signal SL described above. The voltage detector 17 detects a value of the diagnostic voltage Vb. An analog to digital converter (AD converter) included in the microcomputer 12 may function as the voltage detector 17. Alternatively, an analog to digital converter provided outside of the microcomputer 12 may function as the voltage detector 14. The diagnoser 18 detects a short circuit of the switch SWH, SWL based on the diagnostic voltage Vb.

The voltage detector 14 and the diagnoser 15 included in the microcomputer 11 are similar to the voltage detector 17 and the diagnoser 18 included in the microcomputer 12, respectively, in configuration and function. In order to secure redundancy for increasing reliability, two sets of similar configuration are provided. In the following description, the operation of the voltage detector 14 and the diagnoser 15 will be described as a representative example. Although there is no detailed description, the voltage detector 17 and the diagnoser 18 operate in similar manners.

In the present embodiment, when the diagnostic voltage Vb is within a normal voltage range (NVR) during an off period while the two switches SWH and SWL are controlled to be turned off and maintain off states by the respective switching controllers 13 and 16, the diagnoser 15 determines that there is no short circuit in the two switches SWH and SWL. The Normal voltage range is preliminarily set based on a value of the diagnostic voltage Vb, which is also the divided voltage, during the off period in the normal operation state. When the diagnosis voltage Vb during the off period is outside the normal voltage range, the diagnoser 15 determines that a short circuit has occurred in at least one of the switches SWH, SWL.

When the short circuit occurs in the upstream switch SWH, a supply line of the control signal SH that controls turn-on and turn-off of the switch SWH is short circuited to a voltage line having a high level voltage. This kind of short circuit is also known as a fixing failure. The fixing failure occurs in the upstream switch SWH may also cause a short circuit in the downstream switch SWL. Specifically, a supply line of the control signal SL that controls turn-on and turn-off of the downstream switch SWL is short circuited to the voltage line having the high level voltage when the fixing failure occurs in the upstream switch SWH. Thus, a short circuit of the downstream switch SWL includes a short circuit caused by the downstream switch SWL itself and the short circuit caused by the fixing failure.

The following will describe a diagnosing method executed by the diagnoser to determine a failure occurrence in the switches SWH and SWL. In the above-described circuit structure, a current flows through, in order, the power supply terminal P1, the current limiting circuit 8, the resistor 9, the output terminal P2, the coil 4a of solenoid 4. In the present disclosure, the current flowing through the current limiting circuit 8 and the resistor 9 will be referred to as a leak current IL, a period while both of the upstream switch SWH and the downstream switch SWL are controlled by the respective switching controllers 13, 16 to be on states will be referred to as an on period, and a period while both of the upstream switch SWH and the downstream switch SWL are controlled by the respective switching controllers 13, 15 to be off state will be referred to as an off period. The leak current IL flows during both of the on period and the off period.

A current value of the current limiting circuit 8 and a resistance value of the resistor 9 are set so that a value of the leak current IL during the off period is lower than a value of an off current. The off current is preliminarily set to be lower than a lower limit, for example, 1 mA of an operation current at which the solenoid 4 switches to an operable state. When switching to the operable state, the contact 4b of the solenoid 4 is closed. When the leak current during the off period is set to be lower than the value of the off current, the diagnostic voltage Vb changes in response to on state and off state of the switches SWH and SWL as follows.

During a period while the upstream switch SWH is in on state and the downstream switch SWL is in off state, the diagnostic voltage Vb becomes close to the power supply voltage Va as shown in the following numerical expression 1.

$$Vb \approx Va \quad \text{(Expression 1)}$$

During a period while the upstream switch SWH is in off state and the downstream switch SWL is in on state, the diagnostic voltage Vb becomes close to 0 volt as shown in the following numerical expression 2. A resistance of the coil 4a of the solenoid 4 is set to be sufficiently smaller than a resistance of the resistor 9. For example, the resistance of the coil 4a may be set to several mΩ so that the diagnostic voltage Vb becomes close to 0 volt during the off state of upstream switch SWH and the on state of downstream switch SWL.

$$Vb \approx 0 \text{ Volt} \quad \text{(Expression 2)}$$

During the off state of both switches SWH, SWL, the diagnostic voltage Vb has an intermediate potential between the power supply voltage Va and 0 volt as shown in the following numerical expression 3. In the following numerical expression 3, the resistance of resistor 9 is shown by R1.

$$Vb = IL \times R1 \quad \text{(Expression 3)}$$

In the normal operation state where both of the upstream switch SWH and the downstream switch SWL have no short circuit, the diagnostic voltage Vb during the off period becomes the intermediate potential as shown in the above numerical expression 3. When a short circuit occurs in the upstream switch SWH, the diagnostic voltage Vb during the off period becomes close to the power supply voltage Va as shown in the above numerical expression 1 similar to the case where the upstream switch SWH is in on state and the downstream switch is in off state.

When a short circuit occurs in the downstream switch SWL, the diagnostic voltage Vb during the off period becomes close to 0 volt as shown in the above numerical expression 2 similar to the case where the upstream switch SWH is in off state and the downstream switch is in on state.

When the diagnostic voltage Vb is close to the intermediate potential during the off period, the diagnoser 15 determines that no short circuit occurs in the two switches SWH and SWL. When the diagnostic voltage Vb is close to the power supply voltage Va, the diagnoser 15 determines that a short circuit occurs in the upstream switch SWH. When the diagnostic voltage Vb is close to 0 volt, the diagnoser 15 determines that a short circuit occurs in the downstream switch SWL.

Figure 2:
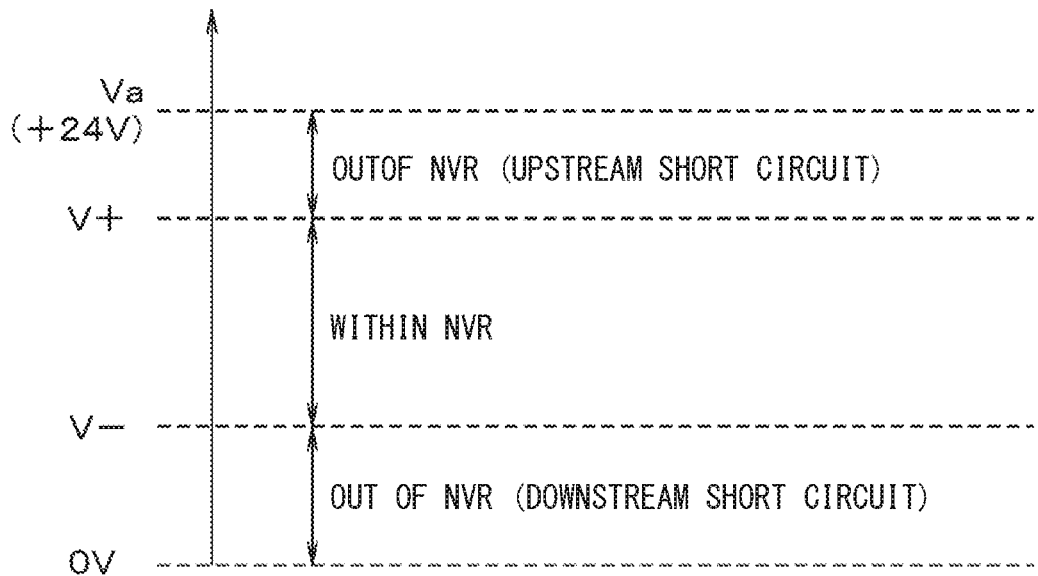
FIG. 2 is a diagram showing a threshold used in a diagnosis according to the first embodiment.

In the present embodiment, when the value of the diagnostic voltage Vb detected by the voltage detector 14 exceeds a threshold value V+, the diagnoser 15 determines that a short circuit occurs in the upstream switch SWH that is connected to the node N1 and arranged upstream closer to the power supply terminal P1 compared with the downstream switch SWL connected to the node N1. The node N1 is an output node of the diagnostic voltage Vb. As shown in FIG. 2, the threshold value V+ is set to a predetermined value which is higher than the intermediate potential (IL× R1) and lower than the power supply voltage Va.

When the value of the diagnostic voltage Vb detected by the voltage detector 14 is lower than the threshold value V−, the diagnoser 15 determines that a short circuit occurs in the downstream switch SWL that is connected to the node N1 and arranged downstream closer to the output terminal P2 compared with the upstream switch SWL connected to the node N1. As shown in FIG. 2, the threshold value V− is set to a predetermined value which is lower than the intermediate potential and higher than 0 volt. A range between the threshold value V− and the threshold value V+ corresponds to the normal voltage range. The threshold value V+ corresponds to an upper limit of the normal voltage range, and the threshold value V− corresponds to the lower limit of the normal voltage range.

Figure 3:
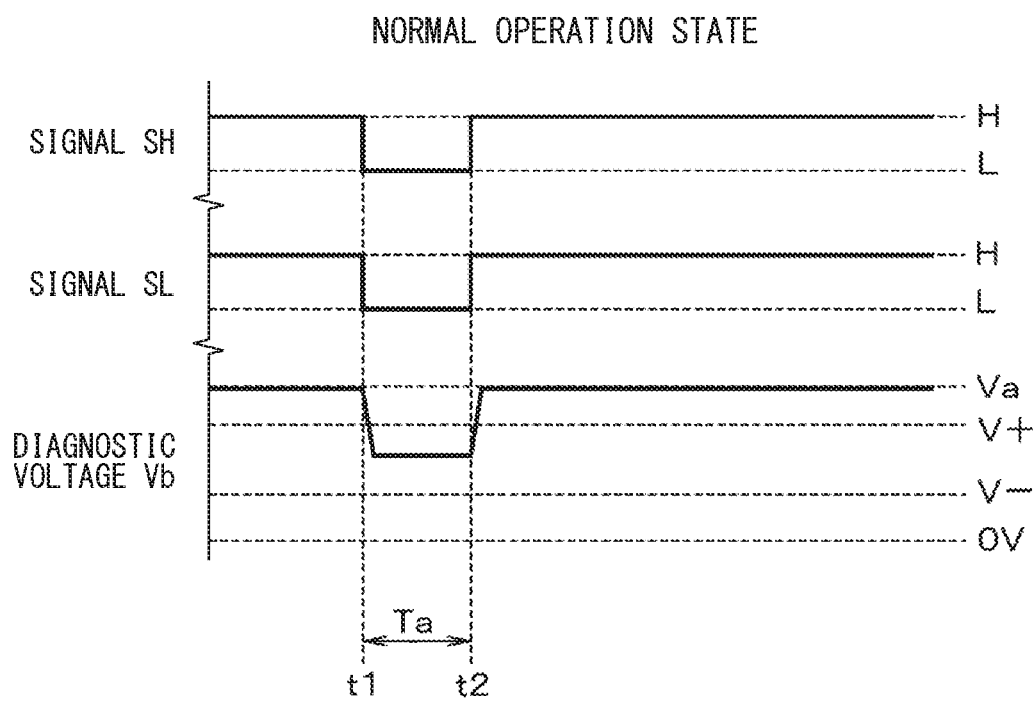
FIG. 3 is a timing chart showing a diagnosis in a normal operation state according to the first embodiment.
Figure 4:
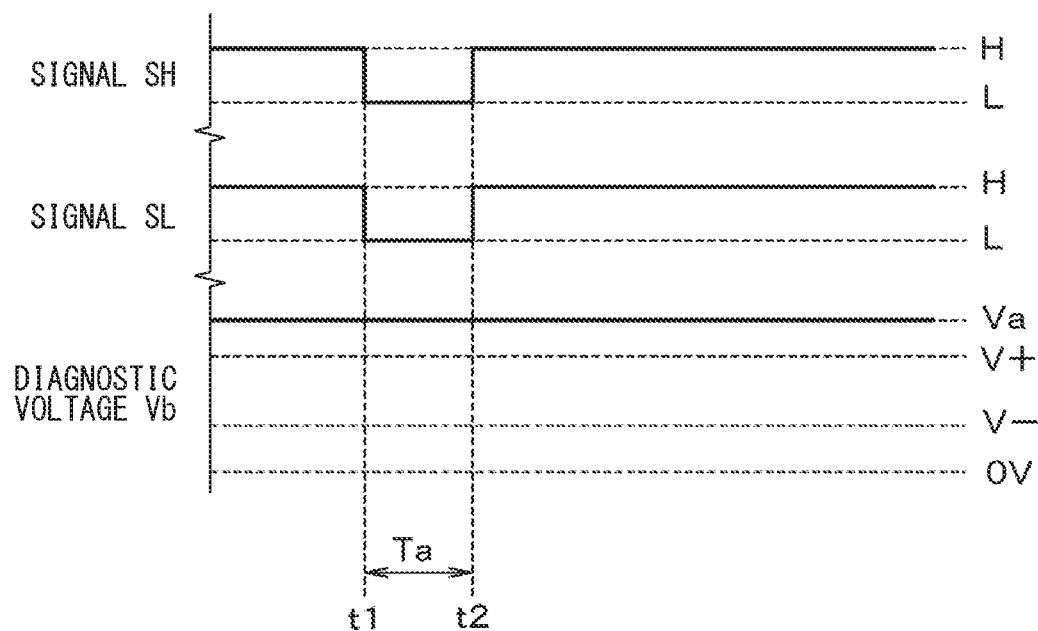
FIG. 4 is a timing chart showing a diagnosis when an upstream short circuit occurs according to the first embodiment.
Figure 5:
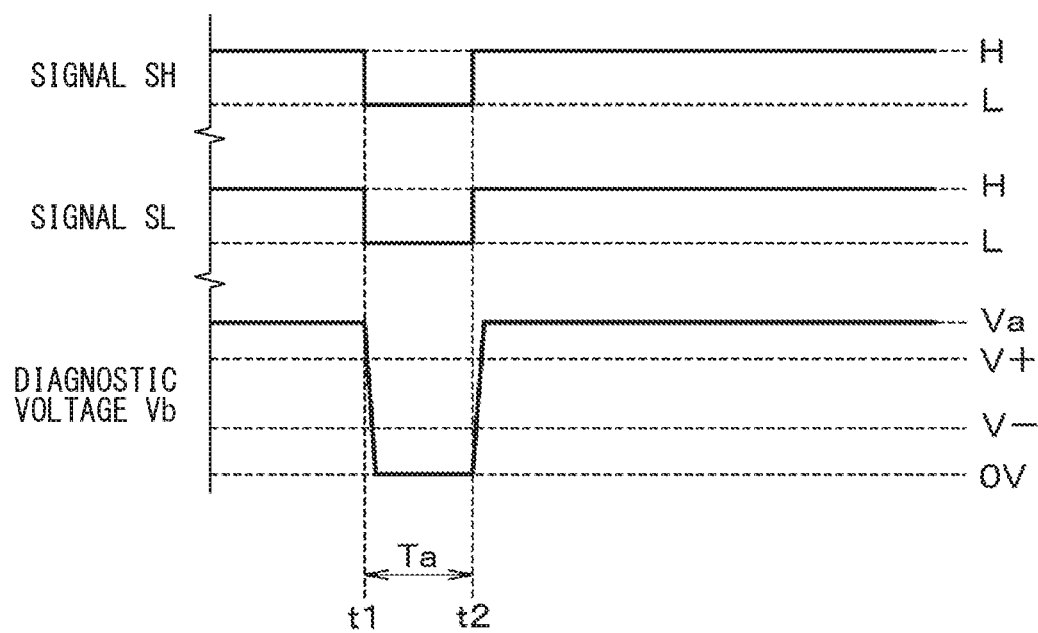
FIG. 5 is a timing chart showing a diagnosis when a downstream short circuit occurs according to the first embodiment.

The following will describe diagnostic sequences of failure diagnosis of the switches SWH and SWL executed by the diagnoser 15 according to the present embodiment with reference to timing charts of FIG. 3 to FIG. 5. In FIG. 3 to FIG. 5, high levels of the control signals SH and SL are shown by "H", and low levels of the control signals SH and SL are shown by "L". It is supposed that the failure diagnosis of the switches SWH and SWL is executed in the normal operation state where the power supply, that is, the power supply voltage Va is applied to the solenoid 4.

As shown in FIG. 3 to FIG. 5, a period before time point t1 and a period after time point t2 are normal operation periods in which power is supplied to the solenoid 4, and both of the control signals SH and SL are at high levels. Thus, both of the upstream switch SWH and the downstream switch SWL are controlled to be on states in the period before the time point t1 and the period after the time point t2. A period Ta from the time point t1 to the time point t2 is a diagnostic period for diagnosing the switches SWH and SWL, and both of the control signals SH and SL are set to low levels for controlling respective switches SWH and SWL to be off states.

As described above, the diagnostic sequence of the present embodiment requires only one procedure, that is, one operation of controlling both switches SWH and SWL to be off states. The diagnostic period is set to be sufficiently shorter than a reaction period of the solenoid 4. The reaction period of the solenoid 4 is a period necessary for the contact 4b of the solenoid is actually turned off after a supply of the power supply voltage Va to the solenoid 4 is cut off. The solenoid 4 is configured to so that the contact 4b is not turned off even though both of the upstream switch SWH and the downstream switch SWL are turned off for the failure diagnosis.

(1) Diagnosis Under Normal Operation State

In the normal operation state where none of the switches SWH, SWH has a short circuit, the diagnoser 15 executes the diagnosis as the following. As shown in FIG. 3, in the normal operation state, at the time point t1, which is a start of the period Ta, both of the switches SWH and SWL are turned off. Thus, the diagnostic voltage Vb starts to decrease from the power supply voltage.

When the diagnostic voltage Vb decreases to the above-mentioned intermediate potential (IL×R1) and maintains the intermediate potential during most of the period Ta. The diagnoser 15 executes the failure diagnosis of the switches SWH and SWL based on the detected diagnostic voltage Vb during the period Ta. In this case, the diagnostic voltage Vb in the period Ta is between the threshold V+ and the threshold V−. Thus, the diagnoser 15 determines that no short circuit occurs in the switches SWH and SWL.

(2) Diagnosis Under Occurrence of Upstream Short Circuit

In an abnormal operation state where the upstream switch SWH has a short circuit, the diagnoser 15 executes the diagnosis as the following. As shown in FIG. 4, when the short circuit occurs in the upstream switch SWH, the diagnostic voltage Vb maintains the power supply voltage Va due to the short circuit occurred in the upstream switch SWH after both of the switches SWH and SWL are turned off at the time point t1 which is the start of the period Ta.

The diagnostic voltage Vb maintains the power supply voltage Va during the period Ta. The diagnoser 15 executes the failure diagnosis of the switches SWH and SWL based on the detected diagnostic voltage Vb during the period Ta. In this case, the diagnostic voltage Vb during the period Ta is equal to the power supply voltage Va, that is, higher than the threshold V+. Thus, the diagnoser 15 determines that a short circuit occurs in the upstream switch SWH.

(3) Diagnosis Under Occurrence of Downstream Short Circuit

In an abnormal operation state where the downstream switch SWL has a short circuit, the diagnoser 15 executes the diagnosis as the following. As shown in FIG. 5, when the short circuit occurs in the downstream switch SWH, the diagnostic voltage Vb decreases from the power supply voltage Va after both of the switches SWH and SWL are turned off at the time point t1 which is the start of the period Ta.

The diagnostic voltage Vb decreases to 0 volt and maintains 0 volt during most of the period Ta. The diagnoser 15 executes the failure diagnosis of the switches SWH and SWL based on the detected diagnostic voltage Vb during the period Ta. In this case, the diagnostic voltage Vb during the period Ta is 0 volt, that is, lower than the threshold V−. Thus, the diagnoser 15 determines that a short circuit occurs in the downstream switch SWL.

As described above, according to the configuration of the present embodiment, when diagnosing a short circuit of the switches SWH and SWL, it is not necessary to turn off the multiple switches individually and alternately as described in the comparative example. All of the switches can be turned off and turned on at the same time. Therefore, according to this embodiment, the diagnosis period of the switches SWH and SWL included in the output circuit 5 can be shortened compared to the comparative example.

Figure 6:
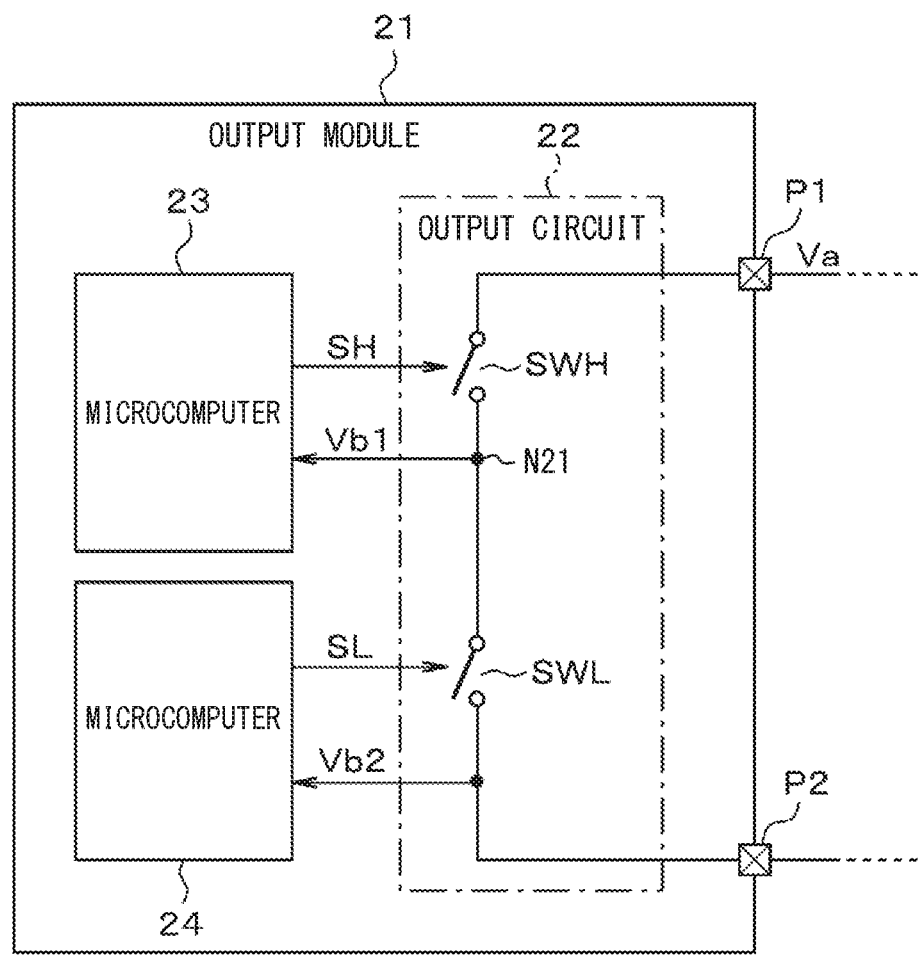
FIG. 6 is a diagram showing a configuration of an output module according to a comparative example.

The following will describe advantages obtained by the present embodiment in detail in comparison with the comparative example shown in FIG. 6. In the comparative example, a configuration of the output module is similar to the present embodiment except the voltage divider circuit 7.

As shown in FIG. 6, an output module 21 of the comparative example includes an output circuit 22, a first microcomputer 23, and a second microcomputer 24. The output circuit 22 includes two switches SWH and SWL connected in series between the power supply terminal P1 and the output terminal P2.

The first microcomputer 23 outputs the control signal SH to control turn-on and turn-off of the upstream switch SWH. The second microcomputer 24 outputs the control signal SL to control turn-on and turn-off of the downstream switch SWL. A voltage obtained at a node N21, which is a common connection node of the upstream switch SWH and the downstream switch SWL, is sent to the first microcomputer 23 as a first diagnostic voltage Vb1. A voltage obtained at a downstream terminal of the downstream switch SWL is sent to the second microcomputer 24 as a second diagnostic voltage Vb2. The first microcomputer 23 determines a short circuit occurred in the upstream switch SWH based on the first diagnostic voltage Vb1. The second microcomputer 24 determines a short circuit occurred in the downstream switch SWL based on the second diagnostic voltage Vb2.

Figure 7:
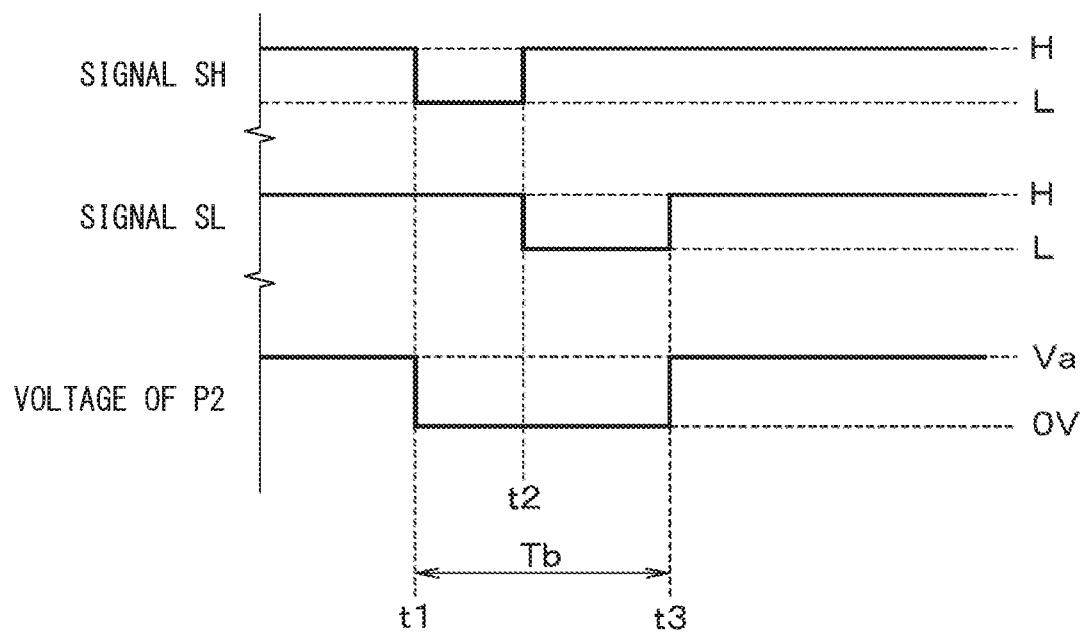
FIG. 7 is a timing chart showing a diagnostic sequence according to the comparative example.

In the comparative example having the above-described configuration, when determining whether a short circuit occurs in any of the switch SWH and SWL, it is necessary to control turn-on and turn-off of each switch SWH, SWL independently from one another and in sequential. FIG. 7 shows a diagnostic sequence in a normal operation state according to the comparative example. In the failure diagnosis in the normal operation state, the upstream switch SWH is turned off first during a period from the time point t1 to a time point t2. Then, the downstream switch SWL is turned off during a period from the time point t2 to a time point t3. Thus, the failure diagnosis requires two operations including turn-off of the upstream switch SWH and turn-off of the downstream switch SWL.

In the comparative example, a period Tb from the time point t1 to the time point t3, which is the diagnosis period becomes a relatively long period. The diagnosis period Tb in the comparative example is about twice of the diagnosis period Ta in the present embodiment. During the diagnosis period Tb, either the switch SWH or the switch SWL is turned off, and the voltage at the output terminal P2 becomes 0 volt. Thus, a power supply, that is, an application of the power supply voltage Va to the solenoid 4 is cut off.

In the comparative example, as described above, the application of the power supply voltage Va is stopped for the relatively long period Tb. Thus, the solenoid 4 having a slow reaction speed is required to be used in order to maintain the on state of the contact 4b for the period Tb. This kind of solenoid 4 also has low reaction speed to an emergency stop, and takes a long time to emergently stop the operation. In the present embodiment, the diagnosis sequence only needs one operation of turning off the multiple switches at the same time in the normal operation state. Thus, the diagnosis period during which the power supply to the solenoid 4 is cut off is decreased to a half of the diagnosis period in the comparative example.

According to the present embodiment, the diagnosis period for diagnosing the switches SWH, SWL is shortened compared with the comparative example. Thus, when the diagnosis of short circuit occurred in the switches SWH and SWL is executed in the normal operation state, the solenoid 4 having a high responsiveness to power interruption can be used in the present embodiment compared with the comparative example. The solenoid 4 having the high responsiveness has a high reaction speed to the power interruption. In the present embodiment, when the motor M that is a device controlled by the solenoid 4 needs an emergency stop, the power supply from the output module 3 to the solenoid 4 having the high responsiveness is cut off. Thus, the operation of the motor M can be stopped promptly, which ensures a good safety.

Usually, the output module of the PLC is configured to supply power to two or more loads. In such a configuration, a short circuit may occur between the output terminals connected to respective loads, that is, between two or more channels corresponding to respective loads. When the diagnosis of the output circuit corresponding to each channel is performed at the same time, it becomes difficult to detect such a short circuit occurred between the channels. Thus, the diagnosis period of each channel of the corresponding output circuit is required to be shifted from one another.

A PLC functional safety standard specifies a period required for diagnosis, and it is necessary to finish the diagnosis within the specified period. As described above, according to the present embodiment, the period required for diagnosis is reduced to about a half of the period required in the comparative example. Thus, in the specified period according to the PLC safety standard, the configuration of the present embodiment is possible to diagnose twice of the output circuits corresponding to the channels compared with the comparative example.

Figure 8:
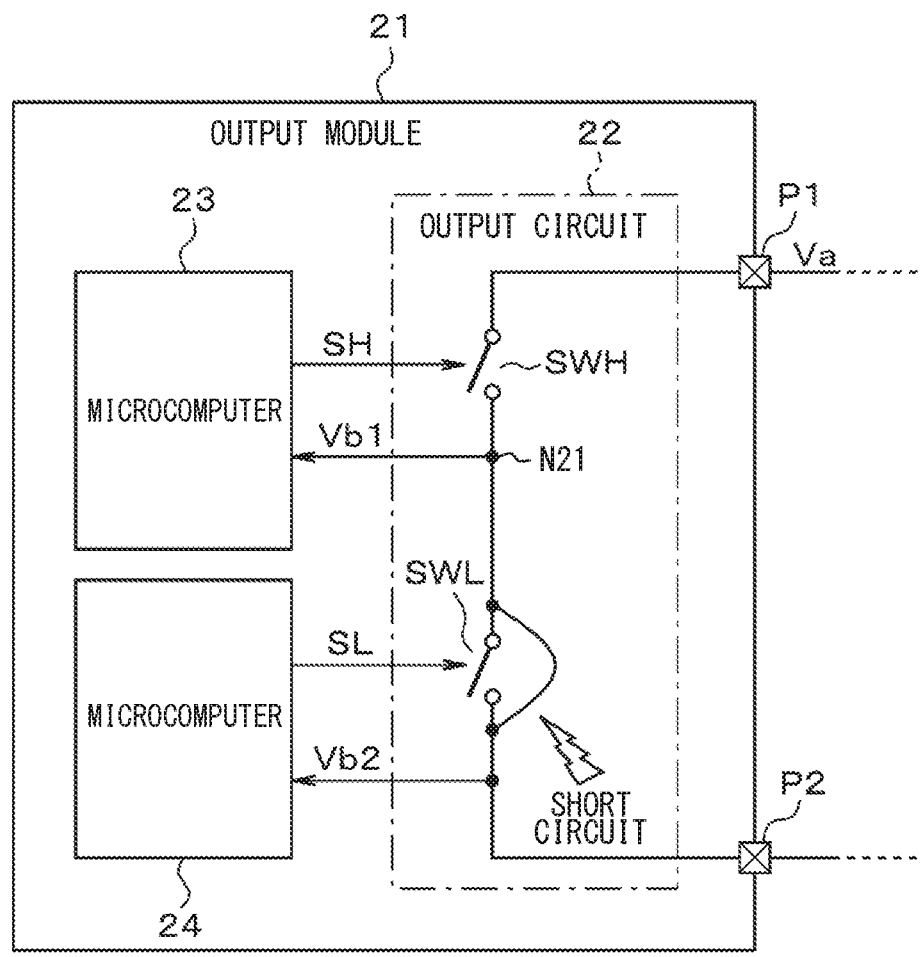
FIG. 8 is a diagram showing a configuration of the output module according to the comparative example when a short circuit occurs in the downstream switch.

In the present embodiment, when the diagnosis of the short circuit occurred in the switches SWH and SWL is executed during a power supply stop state of the solenoid 4 in which a power supply, that is, an application of the power supply voltage Va to the solenoid 4 is stopped, the diagnosis can be carried out in the same manner as the normal operation state. The comparative example fails to provide this advantage. In the comparative example, when a short circuit failure only occurs in the downstream switch SWL in the power supply stop state as shown in FIG. 8, the short circuit occurred in the downstream switch SWL cannot be detected.

Figure 9:
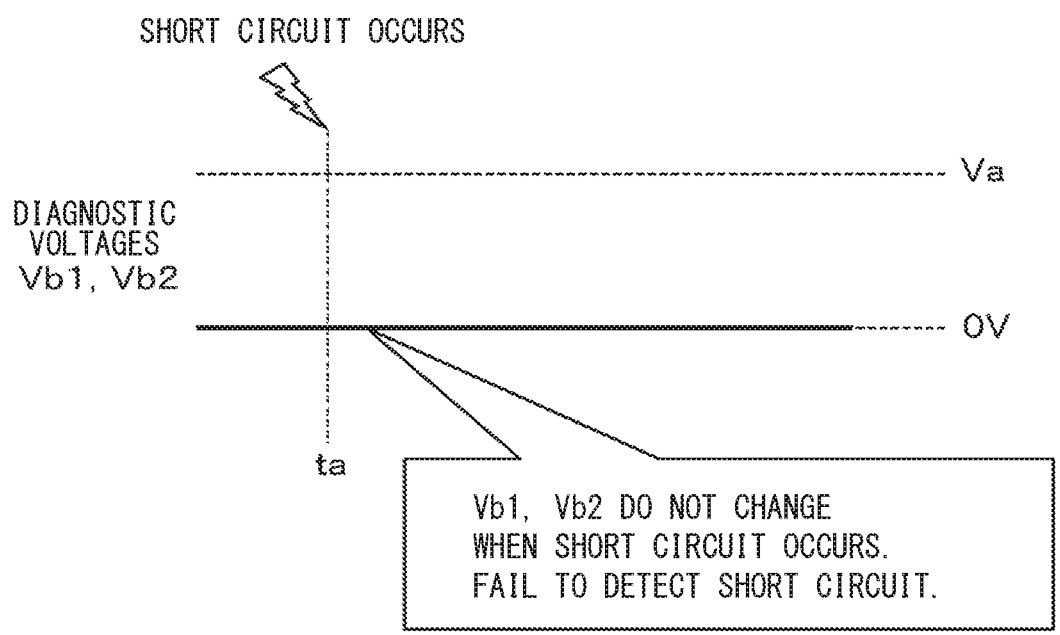
FIG. 9 is a timing chart showing a change in a diagnostic voltage before and after a short circuit occurs in the downstream switch according to the comparative example.

As shown in FIG. 9, in the comparative example, during a period while no short circuit occurs in the downstream switch SWL before the time point ta and a period while a short circuit occurs in the downstream switch SWL after the time point ta, the diagnostic voltage Vb1 and the diagnostic Vb2 maintain 0 volt since the power supply to the solenoid 4 is in stop state. In the comparative example, in the power supply stop state, the diagnostic voltage Vb1 and the diagnostic voltage Vb2 do not change although a short circuit occurs in the downstream switch SWL. Therefore, the short circuit cannot be detected.

In the comparative example, when the upstream switch SWH is turned on during the power supply stop state of the solenoid 4, a short circuit occurred in the downstream switch SWL can be detected. However, when the upstream switch SWH is turned on in a state where a short circuit occurs in the downstream switch SWL, the power supply voltage Va is applied to the solenoid 4, and the contact 4b of the solenoid 4 is accidentally turned on even when the solenoid 4 is set in the stop state.

Figure 10:
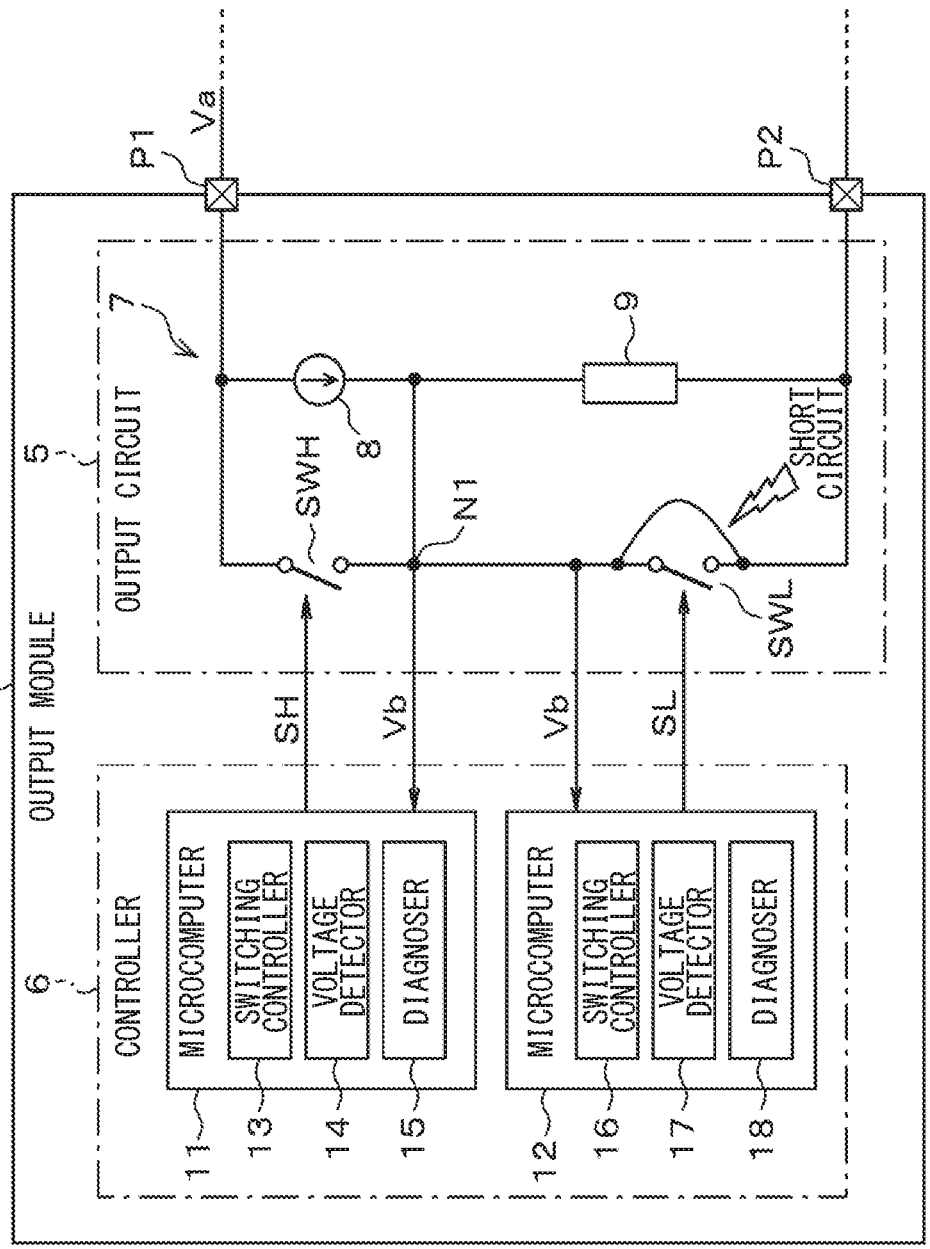
FIG. 10 is a diagram showing a configuration of the output module according to the first embodiment when a short circuit occurs in the downstream switch.

In the present embodiment, similar to the normal operation state, the diagnostic voltage Vb changes according to an on state or off state of each switch SWH, SWL in the power supply stope state of the solenoid 4. As shown in FIG. 10, when no short circuit occurs in the upstream switch SWH and a short circuit only occurs in the downstream switch SWL, the short circuit occurred in the downstream switch SWL can be detected even when the power supply to the solenoid 4 is in stopped state.

Figure 11:
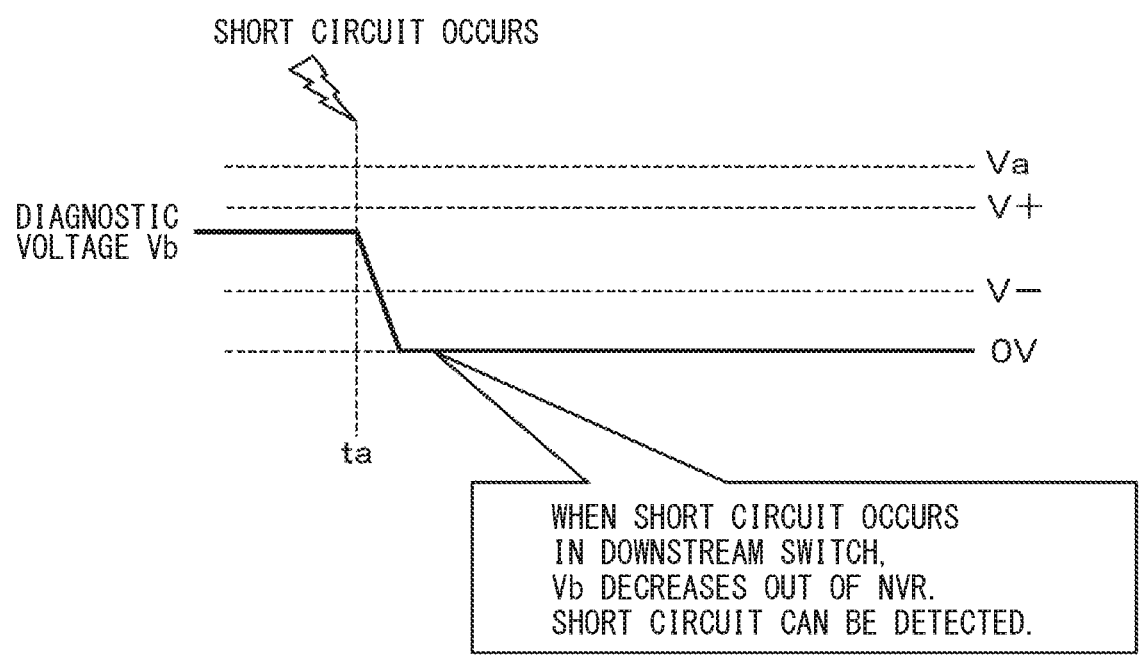
FIG. 11 is a timing chart showing a change in a diagnostic voltage before and after a short circuit occurs in the downstream switch according to the first embodiment.

FIG. 11 shows the diagnostic voltage Vb in the power supply state according to the present embodiment. During a period while no short circuit occurs in the downstream switch SWL before the time point ta, the diagnostic voltage Vb is within the normal voltage range. During a period after a short circuit occurs in the downstream switch SWL at the time point ta, the diagnostic voltage Vb decreases to 0 volt and maintains 0 volt. In the present embodiment, the diagnostic voltage Vb changes corresponding to an occurrence of a short circuit in the downstream switch SWL. Thus, the short circuit occurred in the downstream switch SWL can be detected.

In the present embodiment, when both switches SWH and SWL are controlled to be turned off by the respective switching controllers 13 and 16 in the power supply stop state, no current is supplied from the power supply terminal P1 to the solenoid 4 through the switches SWH and SWL. However, a leak current IL is supplied from the power supply terminal P1 to the solenoid 4 through the current limiting circuit 8 and the resistor 9 of the voltage divider circuit 7. When the leak current IL is high enough to operate the solenoid 4, that is, turn on the contact 4b of the solenoid 4, the solenoid 4 and the motor M may operate erroneously even though the solenoid 4 is set in the stop state.

In the present embodiment, the leak current IL flowing through the voltage divider circuit 7 during the off period in which the switches SWH and SWL are controlled to be in off states by the switching controllers 13 and 16 is preliminary set to lower than a lower limit of operation current of the solenoid 4. With this configuration, an erroneous turn-on of the solenoid 4 by the leak current IL flowing through the voltage divider circuit 7 in the power supply stop state can be avoided, and it is possible to reliably maintain the solenoid 4 and the motor M in the off states.

In the present embodiment, when the diagnostic voltage Vb detected by the voltage detector 14 exceeds the threshold V+ that corresponds to the upper limit of the normal voltage range, the diagnoser 15 determines that a short circuit occurs in the upstream switch SWH. When the diagnostic voltage Vb detected by the voltage detector 14 is lower than the threshold V− that corresponds to the lower limit of the normal voltage range, the diagnoser 15 determines that a short circuit occurs in the downstream switch SWL. With this configuration, a short circuit occurred in either switch SWH, SWL can be detected and a switch where the short circuit is occurred can be identified with high accuracy.

Second Embodiment

Figure 12:
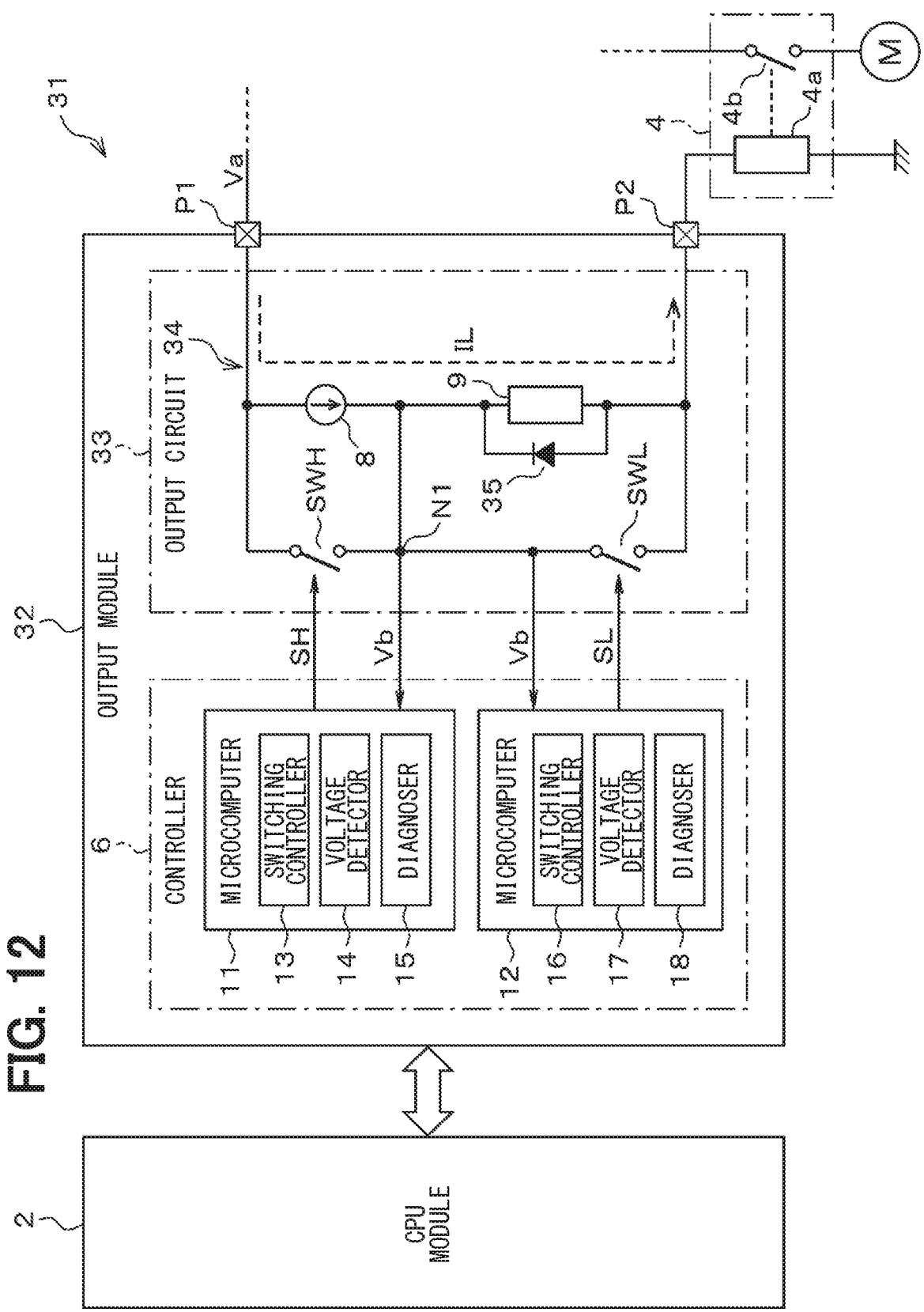
FIG. 12 is a diagram showing a configuration of a PLC according to a second embodiment.

The following will describe a second embodiment of the present disclosure with reference to FIG. 12. As shown in FIG. 12, a PLC 31 according to the present embodiment includes an output module 32, and the output module 32 includes an output circuit 33. The output circuit 33 includes a voltage diving circuit 34 instead of the voltage divider circuit 7 in the first embodiment. The voltage divider circuit 34 includes a diode 35 in addition to the configuration of the voltage divider circuit 7 in the first embodiment. The diode 35 is connected in parallel with the resistor 9, an anode of the diode 35 is connected to the output terminal P2.

The configuration of the present embodiment provides the following advantages. In the output module 32 of the PLC 31, suppose that the output terminal P2 is short circuited to a point having the power supply voltage Va, for example, +24 volts. This kind of short circuit is also referred to as a power supply failure. When the power supply failure occurs, the power supply voltage is supplied to the solenoid 4 even when the switches SWH and SWL are turned off, and this failure cannot be eliminated on the side of the output module 32.

In the output module 32, it is necessary to reliably detect an occurrence of the power supply failure and transmit the detection result of power supply failure to the CPU module 2. In the configuration of the present embodiment, the voltage divider circuit 34 includes the diode 35. When the power supply failure occurs, that is, the output terminal P2 is short circuited to the power supply voltage Va, since the diode 35 is connected in parallel with the resistor 9, the diagnostic voltage Vb, which is the voltage divided by the resistor 9, becomes same as the power supply voltage Va even though the upstream switch SWH and the downstream switch SWL are turned off. Therefore, the diagnoser 15 can determine the power supply failure at the output terminal P2 based on the diagnostic voltage Vb.

Third Embodiment

Figure 13:
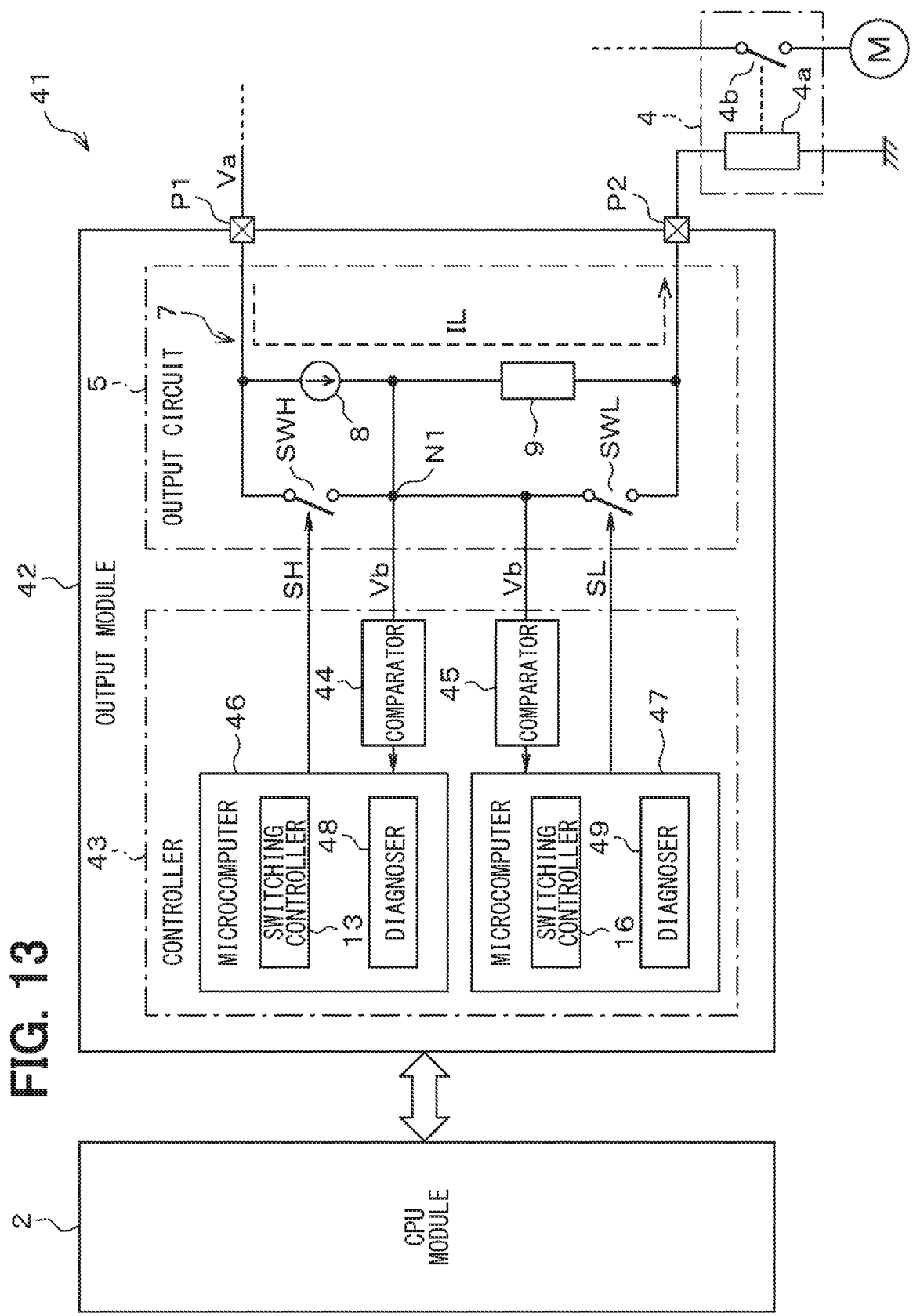
FIG. 13 is a diagram showing a configuration of a PLC according to a third embodiment.

The following will describe a third embodiment of the present disclosure with reference to FIG. 13. As shown in FIG. 13, a PLC 41 according to the present embodiment includes an output module 42, and the output module 42 includes a controller 43. The controller 43 in the present embodiment is different from the controller 6 of the first embodiment. The controller 43 in the present embodiment includes a first microcomputer 46, a second microcomputer 47, a first comparator 44, and a second comparator 45.

Each of the comparators 44 and 45 may be configured by, for example, a window comparator. The diagnostic voltage Vb is input to both of the comparators 44 and 45. Each comparator 44 and 45 compares the inputted diagnostic voltage Vb with the above-described normal voltage range, and outputs a signal whose level inverts according to the comparison result. The comparator 44 and the comparator 45 have similar configuration and function. In order to provide redundancy for increasing reliability, two sets of similar configuration are provided.

The microcomputer 46 is different from the microcomputer 11 in that the voltage detector 14 is omitted, and the microcomputer 46 includes a diagnoser 48 instead of the diagnoser 15. The diagnoser 48 determines, based on the signal output from the comparator 44, a short circuit occurred in the switches SWH and SWL. The microcomputer 47 is different from the microcomputer 12 in that the voltage detector 17 is omitted, and the microcomputer 47 includes a diagnoser 49 instead of the diagnoser 18. The diagnoser 49 determines, based on the signal output from the comparator 45, a short circuit occurred in the switches SWH and SWL.

According to the present embodiment, the diagnoser 48, 49 determines a short circuit occurred in the switches SWH and SWL based on the output signal from the comparator 44, 45. As described above, the level of the output signal from the comparator 44, 45 when the inputted diagnostic voltage Vb is within the normal voltage range inverts from the level of the output signal from the comparator 44, 45 when the inputted diagnostic voltage Vb is out of the normal voltage range. According to the present embodiment, it is possible to determine whether a short circuit occurs in at least one of the switches SWH, SWL, and it is also possible to determine whether short circuits occur in both switches SWH, SWL. However, the present embodiment fails to identify the switch in which the short circuit is occurred. In the present embodiment, the microcomputer 46, 47 does not need to include the voltage detector that detects the value of the diagnostic voltage Vb. Thus, a microcomputer without a built-in analog to digital converter can be used. Thus, the present embodiment can increase a flexibility of circuit design and reduce a manufacturing cost.

Fourth Embodiment

Figure 14:
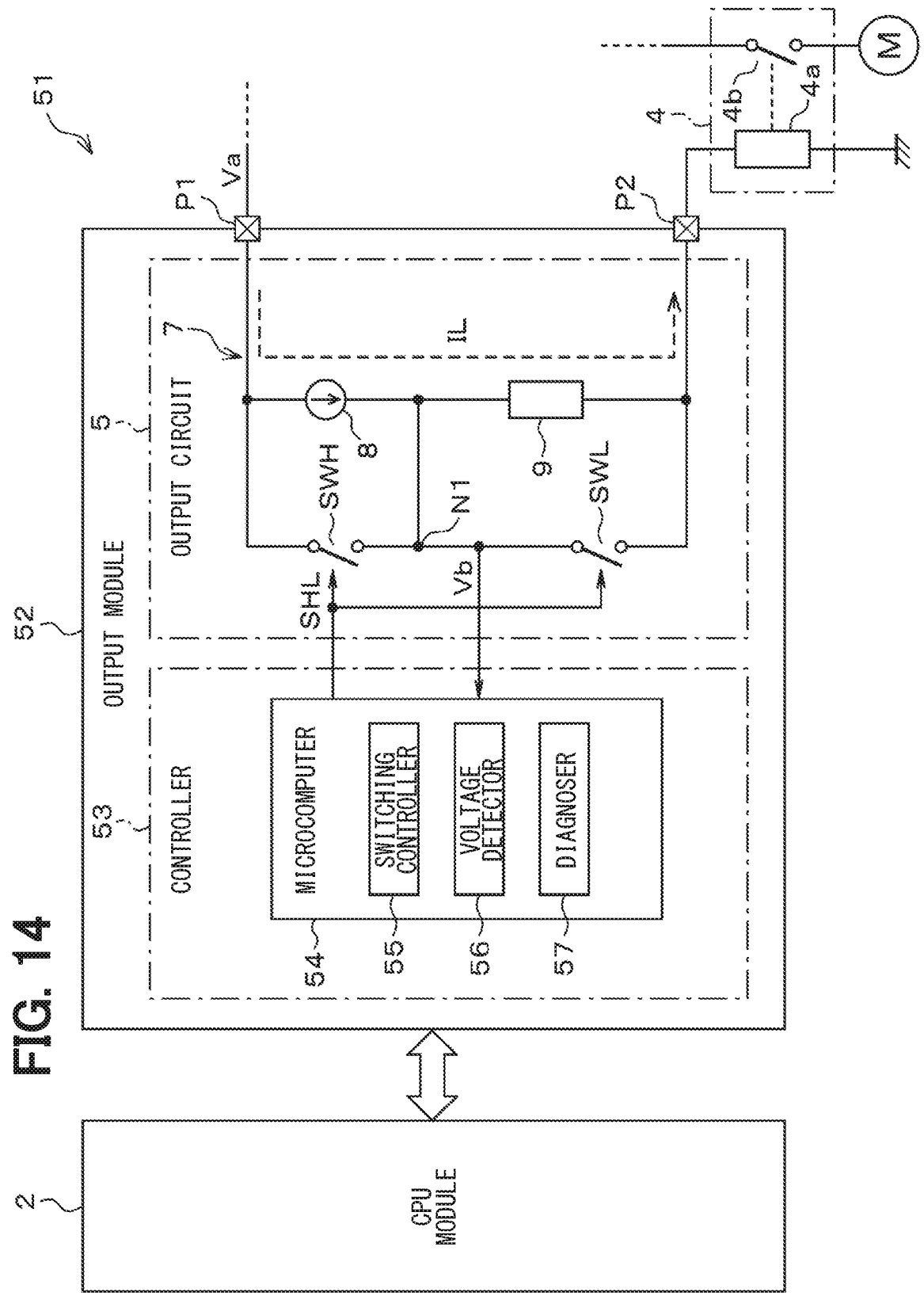
FIG. 14 is a diagram showing a configuration of the PLC according to a fourth embodiment.

The following will describe a fourth embodiment of the present disclosure with reference to FIG. 14. As shown in FIG. 14, a PLC 51 according to the present embodiment includes an output module 52, and the output module 52 includes a controller 53. The controller 53 in the present embodiment includes a microcomputer 54, and is different from the controller 6 in the first embodiment. In the present embodiment, the number of microcomputer included in the controller 53 is reduced to one compared with the first embodiment. In the present embodiment, both switches SWH and SWL are turned on and turned off according to the binary control signal SHL provided by the controller 53. Specifically, when the control signal SHL is high level, both switches SWH and SWL are turned on, and when the control signal SHL is low level, both switches SWH and SWL are turned off.

The microcomputer 54 of the controller 53 includes a switching controller 55, a voltage detector 56, and a diagnoser 57. The switching controller 55 controls a turn-on and a turn-off of the switches SWH, SWL by generating the control signal SHL described above. The voltage detector 56 detects a value of the diagnostic voltage Vb similar to the voltage detector 14 in the first embodiment. The diagnoser 57 detects a short circuit of the switches SWH, SWL based on the diagnostic voltage Vb similar to the diagnoser 15 in the first embodiment.

According to the present embodiment, the number of microcomputers which control turn-on and turn-off of the switches SWH, SWL is reduced from two in the first embodiment to one for canceling the redundancy. However, the output module according to the present embodiment can execute the failure diagnosis similar to the first embodiment. Thus, advantages similar to the first embodiment can be obtained. Further, in the present embodiment, the number of microcomputers and the number of control signals for controlling the switches SWH and SWL are reduced. Thus, the configuration of the output module 52 can be simplified compared with the first embodiment.

Fifth Embodiment

Figure 15:
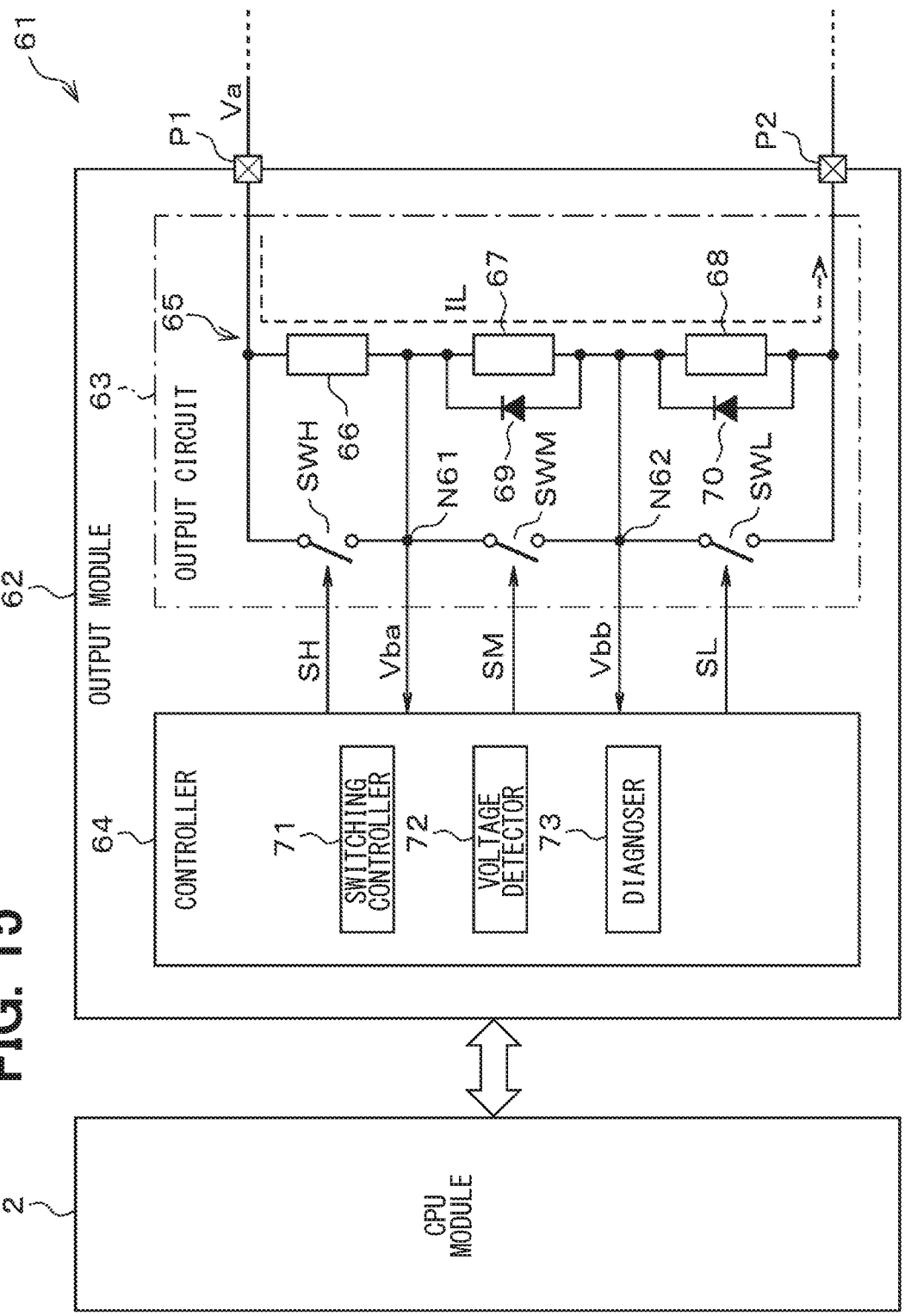
FIG. 15 is a diagram showing a configuration of the PLC according to a fifth embodiment.
Figure 16:
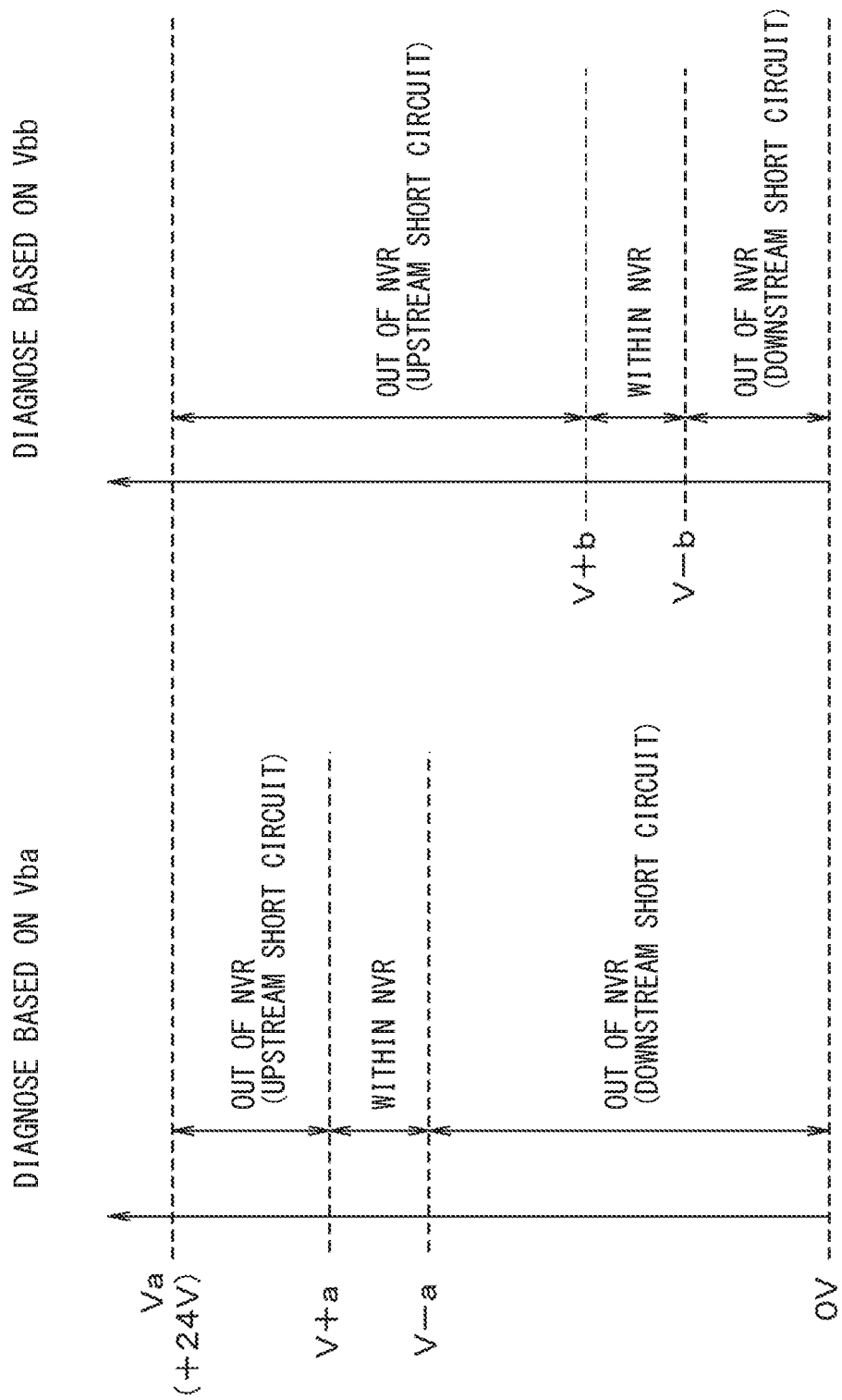
FIG. 16 is a diagram showing a threshold used in a diagnosis according to the fifth embodiment.

The following will describe a fifth embodiment of the present disclosure with reference to FIG. 15 and FIG. 16. As shown in FIG. 15, a PLC 61 according to the present embodiment includes an output module 62, and the output module 62 includes an output circuit 63 and a controller 64. The output circuit 63 in the present embodiment is different from the output circuit 5 of the first embodiment. The controller 64 in the present embodiment is different from the controller 6 of the first embodiment.

The output circuit 63 includes an intermediate switch SWM in addition to the switches SWH, SWL of the output circuit 5 of the first embodiment. The output circuit includes a voltage divider circuit 65 instead of the voltage divider circuit 7 of the first embodiment. The upstream switch SWH, the intermediate switch SWM, and the downstream switch SWL are connected in series between the power supply terminal P1 and the output terminal P2 in the described order. The switch SWM is turned on or turned off based on a binary control signal SM output from the controller 64.

Specifically, the switch SWM is turned on when the control signal SM is high level, and is turned off when the control signal SM is low level. The control signals SM is the same kind of signal with the control signals SH, SL described in the first embodiment. Thus, the switches SWH, SWM, and SWL are turned on and off in the same manner.

Similar to the voltage divider circuit 7 in the first embodiment, the voltage divider circuit 65 outputs a divided voltage. The divided voltage is an analog voltage obtained by dividing a voltage between the power supply terminal P1 and the output terminal P2. The voltage divider circuit 65 includes a first resistor 66, a second resistor 67, and a third resistor 68 connected in series. The first resistor 66 is connected between the power supply terminal P1 and a node N61 which is a common connection node of the upstream switch SWH and intermediate switch SWM. The first resistor 66 is connected in parallel with the upstream switch SWH. The node N61 outputs a first divided voltage which is generated by the voltage divider circuit 65.

The second resistor 67 is connected between the node N61 and a node N62 which is a common connection node of the intermediate switch SWM and the downstream switch SWL. The second resistor 67 is connected in parallel with the intermediate switch SWM. The node N62 outputs a second divided voltage which is generated by the voltage divider circuit 65. The third resistor 68 is connected between the node N62 and the output terminal P2. The third resistor 68 is connected in parallel with the downstream switch SWL.

As described above, three resistors 66 to 68 are connected, respectively, in parallel with the three switches SWH, SWM, SWL. When a current flows through the resistors 66 to 68, a first divided voltage Vba is generated between the first resistor 66 and the second resistor 67, and a second divided voltage Vbb is generated between the second resistor 67 and the third resistor 68. Thus, the resistors 66, 67, 68 correspond to multiple voltage generators. At least one of the resistors 66, 67, 68 may be replaced by a current limiting circuit similar to the current limiting circuit 8 of the first embodiment. The divided voltage Vba output from the node N61 corresponds to the diagnostic voltage Vba, and the divided voltage Vbb output from the node N62 corresponds to the diagnostic voltage Vbb. The diagnostic voltage Vba, Vbb functions as a read back signal for diagnosing a failure occurred in the output circuit 63. The diagnostic voltage Vba, Vbb is input to the controller 64.

The voltage divider circuit 65 further includes a first diode 69 and a second diode 70. The first diode 69 is connected in parallel with the second resistor 67, and an anode of the first diode 69 is connected with the node N62. The second diode 70 is connected in parallel with the third resistor 68, and an anode of the second diode 70 is connected to the output terminal P2.

The controller 64 may be configured by one or more microcomputers. The controller 64 includes a switching controller 71, a voltage detector 72, and a diagnoser 73. The switching controller 71 and the diagnoser 73 are provided by an execution of a computer program stored in a ROM of the microcomputer by a CPU of the microcomputer. By execution of the computer program, the CPU executes a process corresponding to the program in order to provide the switching controller 71 and the diagnoser 73 in software manner. The switching controller 71 and the diagnoser 73 may also be implemented in a hardware manner, or by a combination of software and hardware manners.

The switching controller 71 controls a turn-on and a turn-off of the switches SWH, SWM, SWL by generating the control signals SH, SM, SL described above. The voltage detector 72 detects values of the diagnostic voltages Vba, Vbb. An analog to digital converter included in the microcomputer may function as the voltage detector 72. The diagnoser 73 detects a short circuit of the switch SWH, SWM, SWL based on the diagnostic voltage Vba, Vbb.

In the present embodiment, when the diagnostic voltage Vba is within the normal voltage range during an off period while the three switches SWH, SWM, and SWL are controlled to be turned off and maintain off states by the switching controller 71, the diagnoser 73 determines that there is no short circuit in the switches SWH, SWM, SWL. The Normal voltage range is preliminarily set based on a value of the diagnostic voltage Vba during the off period in the normal operation state. When the diagnosis voltage Vba during the off period is outside the normal voltage range, the diagnoser 73 determines that a short circuit has occurred in at least one of the switches SWH, SWM, SWL.

In the present embodiment, when the diagnostic voltage Vb is within a normal voltage range during an off period while the two switches SWH and SWL are controlled to be turned off and maintain off states by the respective switching controllers 13 and 16, the diagnoser 15 determines that there is no short circuit in the two switches SWH and SWL. The Normal voltage range is preliminarily set based on a value of the diagnostic voltage Vb, which is also the divided voltage, during the off period in the normal operation state. When the diagnosis voltage Vb during the off period is outside the normal voltage range, the diagnoser 15 determines that a short circuit has occurred in at least one of the switches SWH, SWL.

In the present embodiment, the leak current IL flows through the voltage divider circuit 65 similar to the first embodiment. Therefore, the diagnostic voltages Vba and Vbb change depending on operation states of the switches SWH, SWM, SWL similar to the diagnostic voltage Vba in the first embodiment. The diagnostic voltage Vba becomes close to the power supply voltage Va when the upstream switch SWH is in on state and the intermediate switch SWM and the downstream switch SWL are in off states. The diagnostic voltage Vba becomes close to 0 volt when the downstream switch SWL is in on state and the intermediate switch SWM and the upstream switch SWL are in off states. The diagnostic voltage Vba becomes an intermediate potential between the power supply voltage Vba and 0 volt when all of the switches SWH, SWM, SWL are in off states.

The diagnostic voltage Vbb becomes close to the power supply voltage Va when the upstream switch SWH is in on state and the intermediate switch SWM and the downstream switch SWL are in off states. The diagnostic voltage Vbb becomes close to 0 volt when the downstream switch SWL is in on state and the intermediate switch SWM and the upstream switch SWL are in off states. The diagnostic voltage Vbb becomes an intermediate potential between the power supply voltage Vba and 0 volt when all of the switches SWH, SWM, SWL are in off states. The intermediate potential of the diagnostic voltage Vbb is lower than the intermediate potential of the diagnostic voltage Vba.

When the diagnostic voltage Vba, Vbb is close to the corresponding intermediate potential during the off period of all of the switches SWH, SWM, SWL, the diagnoser 73 determines that no short circuit occurs in the switches SWH, SWM, SWL. When the diagnostic voltage Vba is close to the power supply voltage Va in the off period of all of the switches SWH, SWM, SWL, the diagnoser 73 determines that a short circuit occurs in the upstream switch SWH.

When the diagnostic voltage Vba is close to 0 volt in the off period of all of the switches SWH, SWM, SWL, the diagnoser 73 determines that a short circuit occurs in the intermediate switch SWM or downstream switch SWL. When the diagnostic voltage Vbb is close to the power supply voltage Va in the off period of all of the switches SWH, SWM, SWL, the diagnoser 73 determines that a short circuit occurs in the upstream switch SWH or intermediate switch SWM. When the diagnostic voltage Vbb is close to 0 volt in the off period of all of the switches SWH, SWM, SWL, the diagnoser 73 determines that a short circuit occurs in the downstream switch SWL.

In the present embodiment, when a value of the diagnostic voltage Vba detected by the voltage detector 72 exceeds a threshold value V+a, the diagnoser 73 determines that a short circuit occurs in the upstream switch SWH that is connected to the node N61 and arranged upstream closer to the power supply terminal P1 compared with the intermediate switch SWM. The node N61 is an output node of the diagnostic voltage Vba. As shown in FIG. 16, the threshold value V+a is set to a predetermined value which is higher than the intermediate potential and lower than the power supply voltage Va.

When the value of the diagnostic voltage Vba detected by the voltage detector 72 is lower than the threshold value V−a, the diagnoser 73 determines that a short circuit occurs in the intermediate switch SWM, which is connected to the node N61 and arranged downstream closer to the output terminal P2 compared with the upstream switch SWH, or in the downstream switch SWL. As shown in FIG. 16, the threshold value V−a is set to a predetermined value which is lower than the intermediate potential and higher than 0 volt. A range between the threshold value V−a and the threshold value V+a corresponds to the normal voltage range of the diagnostic voltage Vba. The threshold value V+a corresponds to an upper limit of the normal voltage range, and the threshold value V−a corresponds to the lower limit of the normal voltage range.

When a value of the diagnostic voltage Vbb detected by the voltage detector 72 exceeds a threshold value V+b, the diagnoser 73 determines that a short circuit occurs in the intermediate switch SWM, which is connected to the node N62 and arranged upstream closer to the power supply terminal P1 compared with the downstream switch SWL, or in the upstream switch SWH. The node N62 is an output node of the diagnostic voltage Vbb. As shown in FIG. 16, the threshold value V+ba is set to a predetermined value which is higher than the intermediate potential and lower than the power supply voltage Va.

When the value of the diagnostic voltage Vbb detected by the voltage detector 72 is lower than the threshold value V−b, the diagnoser 73 determines that a short circuit occurs in the downstream switch SWL, which is connected to the node N62 and arranged downstream closer to the output terminal P2 compared with the intermediate switch SWM. As shown in FIG. 16, the threshold value V−b is set to a predetermined value which is lower than the intermediate potential and higher than 0 volt. A range between the threshold value V−b and the threshold value V+b corresponds to the normal voltage range of the diagnostic voltage Vbb. The threshold value V+b corresponds to an upper limit of the normal voltage range, and the threshold value V−b corresponds to the lower limit of the normal voltage range.

According to the present embodiment, the number of switches connecting or disconnecting the power supply terminal P1 with/from the output terminal P2 is increased from two to three compared with the first embodiment. The voltage divider circuit 65, correspondingly, includes three resistors 66, 67, 68 that function as voltage generators, and the resistors 66, 67, 68 are connected in series corresponding to the respective switches. Thus, it is possible to adopt t similar diagnostic method to the first embodiment. Thus, advantages similar to the first embodiment can be obtained.

The diagnoser 73 of the present embodiment executes failure diagnosis of the switches SWH, SWM, SWL based on two diagnostic voltages Vba, Vbb. The two diagnostic voltages Vba, Vbb change output from the voltage divider circuit 65 change according to the operation states of the switches SWH, SWM, SWL. Thus, the diagnoser 73 is able to detect a short circuit occurred in at least one of the switches SWH, SWM, SWL, and is also able to identify the switch in which the short circuit is occurred.

Other Embodiments

The present disclosure is not limited to the embodiments that have been described above and illustrated in the drawings, but can arbitrarily be modified, combined, or expanded without departing from a scope of the present disclosure. The numerical values and the like shown in the embodiments described above are examples, and the present disclosure is not limited to the above examples.

In the voltage divider circuit 7, the position of the current limiting circuit 8 and the resistor 9 may be exchanged. That is, the resistor 9 may be positioned upstream close to the power supply terminal P1, and the current limiting circuit 8 may be positioned downstream close to the output terminal P2.

It is also possible to replace the current limiting circuit 8 with another resistor. However, in this case, when the power supply voltage Va fluctuates, a value of the leak current IL and a value of the diagnostic voltage Vb may fluctuate in response to the fluctuation of the power supply voltage Va. Thus, an accuracy of the failure diagnosis executed by comparing the diagnostic voltage with the threshold values V+ and V− may be decreased. When the current limiting circuit 8 is provided as in the first embodiment, even when the power supply voltage Va fluctuates, the value of the leak current IL becomes a constant current value controlled by the current limiting circuit 8, which is provided by a constant current source. Thus a fluctuation of the value of the diagnostic voltage Vb can be suppressed. As a result, it is possible to increase an accuracy of the failure diagnosis.

An application of the present disclosure is not limited to the output module 3 of the PLC 1. The present disclosure may be applied to an output module of any kind of industrial control apparatus equipped with an output circuit that electrically connects or disconnects a power supply terminal to which a power supply voltage is applied and an output terminal connected to an external load.

In the present disclosure, the controller including switching controller and the diagnoser may be implemented by one or more special-purposed computers. Such a special-purposed computer may be provided (i) by configuring (a) a processor and a memory programmed to execute one or more functions embodied by a computer program, or (ii) by configuring (b) a processor including one or more dedicated hardware logic circuits, or (iii) by configuring by a combination of (a) a processor and a memory programmed to execute one or more functions embodied by a computer program and (b) a processor including one or more dedicated hardware logic circuits. Further, the computer program may be stored in a computer-readable non-transitory tangible storage medium as instructions to be executed by a computer.

What is claimed is:

1. An output module of an industrial control apparatus, the output module comprising:
   an output circuit controlling an electrical connection between a power supply terminal to which a power source voltage is applied and an output terminal connected to an external load; and
   a controller controlling an operation of the output circuit, wherein
   the output circuit includes a plurality of switches and a voltage divider circuit, the plurality of switches are connected in series between the power supply terminal and the output terminal and turn on and turn off in a same manner, the voltage divider circuit outputs a divided voltage by dividing a voltage between the power supply terminal and the output terminal,
   the controller includes a switching controller and a diagnoser, the switching controller controls turning on and turning off of the plurality of switches, the diagnoser detects a short circuit occurred in the plurality of switches based on the divided voltage output from the voltage divider circuit,
   the voltage divider circuit includes a plurality of voltage generators each of which generates a voltage between two terminals of the voltage generator when a current flows through the voltage generator, the plurality of voltage generators are respectively connected in parallel with the plurality of switches,
   the divided voltage has a normal voltage range that is preliminarily set based on the divided voltage detected when the plurality of switches are turned off in a normal operation state,
   when the divided voltage detected during an off period while the plurality of switches are in off states is within the normal voltage range, the diagnoser determines that no short circuit is occurred in the plurality of switches,
   when the divided voltage detected during the off period is out of the normal voltage range, the diagnoser determines that the short circuit is occurred in at least one of the plurality of switches,
   the output module further comprises a voltage detector detecting a value of the divided voltage,
   the plurality of switches include an upstream switch and a downstream switch,
   the upstream switch is connected between the power supply terminal and an output node of the divided voltage, and the downstream switch is connected between the output node of the divided voltage and the output terminal,
   when the value of the divided voltage detected by the voltage detector in a state where the upstream switch and the downstream switch are turned off is higher than an upper limit of the normal voltage range, the diagnoser determines that the short circuit has occurred in the upstream switch, and
   when the value of the divided voltage detected by the voltage detector in the state where the upstream switch and the downstream switch are turned off is lower than a lower limit of the normal voltage range, the diagnoser determines that the short circuit has occurred in the downstream switch.

2. The output module according to claim 1, wherein, during the off period while the plurality of switches are in the off states, a current flowing through the plurality of voltage generators is set to be lower than an off current that is preliminarily set.

3. The output module according to claim 1, wherein the voltage divider circuit further includes a diode, the plurality of voltage generators include a downstream voltage generator, the diode is connected in parallel with the downstream voltage generator, and an anode of the diode and one terminal of the downstream voltage generator are connected with the output terminal.

4. The output module according to claim 2, wherein the off current is preliminarily set to be lower than a lower limit of an operation current that powers the external load to operate.

* * * * *